(12) United States Patent
Amaki et al.

(10) Patent No.: US 10,475,518 B2
(45) Date of Patent: Nov. 12, 2019

(54) MEMORY SYSTEM, MEMORY SYSTEM CONTROL METHOD, AND PROGRAM

(71) Applicant: Toshiba Memory Corporation, Minato-ku (JP)

(72) Inventors: Takehiko Amaki, Yokohama (JP); Riki Suzuki, Yokohama (JP); Yoshihisa Kojima, Kawasaki (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/166,409

(22) Filed: Oct. 22, 2018

(65) Prior Publication Data

US 2019/0295658 A1    Sep. 26, 2019

(30) Foreign Application Priority Data

Mar. 22, 2018  (JP) ................. 2018-055211

(51) Int. Cl.

| | |
|---|---|
| *G11C 16/26* | (2006.01) |
| *G11C 16/34* | (2006.01) |
| *G06F 3/06* | (2006.01) |
| *G06F 16/901* | (2019.01) |

(Continued)

(52) U.S. Cl.
CPC ............ *G11C 16/26* (2013.01); *G06F 3/0604* (2013.01); *G06F 3/0653* (2013.01); *G06F 3/0679* (2013.01); *G06F 16/9017* (2019.01); *G11C 16/34* (2013.01); *H01L 27/11556* (2013.01); *H01L 27/11582* (2013.01)

(58) Field of Classification Search
CPC .... G11C 16/26; G06F 11/1016; G06F 3/0604

USPC ............. 365/189.011, 189.14, 189.15
See application file for complete search history.

(56) References Cited

U.S. PATENT DOCUMENTS

| | | |
|---|---|---|
| 9,009,390 B2 | 4/2015 | Choi et al. |
| 9,632,868 B2 | 4/2017 | Song |

(Continued)

FOREIGN PATENT DOCUMENTS

| | | |
|---|---|---|
| JP | 2013-196613 | 9/2013 |
| JP | 6022756 | 11/2016 |

*Primary Examiner* — Han Yang
(74) *Attorney, Agent, or Firm* — Oblon, McClelland, Maier & Neustadt, L.L.P.

(57) ABSTRACT

According to one embodiment, a memory system comprises a nonvolatile memory, and a memory controller configured to manage a history value about setting of a read voltage in performing reading of data from the nonvolatile memory, in accordance with a first management unit and a second management unit, a size of the second management unit being smaller than a size of the first management unit. A first region of the nonvolatile memory corresponds to the first management unit. A plurality of second regions of the nonvolatile memory each correspond to the second management unit. The first region includes the plurality of second regions. The controller is configured to: obtain a first history value for the first region, and obtain a second history value for at least one of the second regions; and in execution of a read operation to a region included in the second regions, when the second history value for the region included in the second regions is not obtained, execute the read operation to the region included in the second regions by using the first history value obtained for the first region.

20 Claims, 14 Drawing Sheets

(51) Int. Cl.
*H01L 27/11582* (2017.01)
*H01L 27/11556* (2017.01)

(56) References Cited

U.S. PATENT DOCUMENTS

2015/0317257 A1\* 11/2015 Seol .................... G06F 21/31
 714/760
2016/0141042 A1\* 5/2016 Peterson ................ G11C 16/26
 365/185.11

\* cited by examiner

FIG.3

| FIRST HIERARCHY (LARGE REGION) NUMBER # | SECOND HIERARCHY (SMALL REGION) NUMBER # | WL NUMBER # | HISTORY VALUE | |
|---|---|---|---|---|
| | | | REPRESENTATIVE HISTORY VALUE | INDIVIDUAL HISTORY VALUE |
| 00 | 000 | 000 | 'BBBBBB' | 'AAAAAA' |
| | | ⋮ | | |
| | | 003 | | |
| | 001 | 004 | | 'BBBBBB' |
| | | ⋮ | | |
| | | 007 | | |
| | 002 | 008 | | (NULL) |
| | | ⋮ | | |
| | | 011 | | |
| | ⋮ | ⋮ | | ⋮ |
| ⋮ | ⋮ | ⋮ | ⋮ | ⋮ |

FIG.7

| SMALL REGION NUMBER # | WL NUMBER # | (a) INITIAL VALUE OF HISTORY VALUE | INDIVIDUAL HISTORY VALUE FLAG | (b) HISTORY VALUE AFTER LEARNING OF HISTORY VALUE OF WL 20 | INDIVIDUAL HISTORY VALUE FLAG | (c) HISTORY VALUE AFTER LEARNING OF HISTORY VALUE OF WL 69 | INDIVIDUAL HISTORY VALUE FLAG |
|---|---|---|---|---|---|---|---|
| 0 | 0 | NULL | 0 | HISTORY VALUE OF WL 20 | 0 | HISTORY VALUE OF WL 69 | 0 |
| 1 | 1, 2, 3 | NULL | 0 | HISTORY VALUE OF WL 20 | 0 | HISTORY VALUE OF WL 69 | 0 |
| 2 | 4, 5, 6, 7 | NULL | 0 | HISTORY VALUE OF WL 20 | 0 | HISTORY VALUE OF WL 69 | 0 |
| 3 | 8, 9, 10, 11 | NULL | 0 | HISTORY VALUE OF WL 20 | 0 | HISTORY VALUE OF WL 69 | 0 |
| 4 | 12, 13, 14, 15 | NULL | 0 | HISTORY VALUE OF WL 20 | 0 | HISTORY VALUE OF WL 69 | 0 |
| 5 | 16, 17, 18, 19 | NULL | 0 | HISTORY VALUE OF WL 20 | 0 | HISTORY VALUE OF WL 69 | 0 |
| 6 | 20, 21, 22, 23 | NULL | 0 | HISTORY VALUE OF WL 20 | 1 | HISTORY VALUE OF WL 20 | 1 |
| 7 | 24, 25, 26, 27 | NULL | 0 | HISTORY VALUE OF WL 20 | 0 | HISTORY VALUE OF WL 69 | 0 |
| 8 | 28, 29, 30, 31 | NULL | 0 | HISTORY VALUE OF WL 20 | 0 | HISTORY VALUE OF WL 69 | 0 |
| 9 | 32, 33, 34, 35 | NULL | 0 | HISTORY VALUE OF WL 20 | 0 | HISTORY VALUE OF WL 69 | 0 |
| 10 | 36, 37, 38, 39 | NULL | 0 | HISTORY VALUE OF WL 20 | 0 | HISTORY VALUE OF WL 69 | 0 |
| 11 | 40, 41, 42, 43 | NULL | 0 | HISTORY VALUE OF WL 20 | 0 | HISTORY VALUE OF WL 69 | 0 |
| 12 | 44, 45, 46 | NULL | 0 | HISTORY VALUE OF WL 20 | 0 | HISTORY VALUE OF WL 69 | 0 |
| 13 | 47 | NULL | 0 | HISTORY VALUE OF WL 20 | 0 | HISTORY VALUE OF WL 69 | 0 |
| 14 | 48 | NULL | 0 | HISTORY VALUE OF WL 20 | 0 | HISTORY VALUE OF WL 69 | 0 |
| 15 | 49, 50, 51 | NULL | 0 | HISTORY VALUE OF WL 20 | 0 | HISTORY VALUE OF WL 69 | 0 |
| 16 | 52, 53, 54, 55 | NULL | 0 | HISTORY VALUE OF WL 20 | 0 | HISTORY VALUE OF WL 69 | 0 |
| 17 | 56, 57, 58, 59 | NULL | 0 | HISTORY VALUE OF WL 20 | 0 | HISTORY VALUE OF WL 69 | 0 |
| 18 | 60, 61, 62, 63 | NULL | 0 | HISTORY VALUE OF WL 20 | 0 | HISTORY VALUE OF WL 69 | 0 |
| 19 | 64, 65, 66, 67 | NULL | 0 | HISTORY VALUE OF WL 20 | 0 | HISTORY VALUE OF WL 69 | 0 |
| 20 | 68, 69, 70, 71 | NULL | 0 | HISTORY VALUE OF WL 20 | 0 | HISTORY VALUE OF WL 69 | 1 |
| 21 | 72, 73, 74, 75 | NULL | 0 | HISTORY VALUE OF WL 20 | 0 | HISTORY VALUE OF WL 69 | 0 |
| 22 | 76, 77, 78, 79 | NULL | 0 | HISTORY VALUE OF WL 20 | 0 | HISTORY VALUE OF WL 69 | 0 |
| 23 | 80, 81, 82, 83 | NULL | 0 | HISTORY VALUE OF WL 20 | 0 | HISTORY VALUE OF WL 69 | 0 |
| 24 | 84, 85, 86, 87 | NULL | 0 | HISTORY VALUE OF WL 20 | 0 | HISTORY VALUE OF WL 69 | 0 |
| 25 | 88, 89, 90, 91 | NULL | 0 | HISTORY VALUE OF WL 20 | 0 | HISTORY VALUE OF WL 69 | 0 |
| 26 | 92, 93, 94 | NULL | 0 | HISTORY VALUE OF WL 20 | 0 | HISTORY VALUE OF WL 69 | 0 |
| 27 | 95 | NULL | 0 | HISTORY VALUE OF WL 20 | 0 | HISTORY VALUE OF WL 69 | 0 |

LOWER SET OF TIERS: small region numbers 0–13
UPPER SET OF TIERS: small region numbers 14–27

FIG.14

| | SMALL REGION NUMBER # | WL NUMBER # | HISTORY VALUE | INDIVIDUAL HISTORY VALUE FLAG | UPDATE TIME | LEARNING TIME TEMPERATURE |
|---|---|---|---|---|---|---|
| LOWER TIER | 0 | 0 | HISTORY VALUE OF WL 69 | 0 | 11d11h11m11s | 40°C |
| | 1 | 1, 2, 3 | HISTORY VALUE OF WL 69 | 0 | 11d11h11m11s | 40°C |
| | 2 | 4, 5, 6, 7 | HISTORY VALUE OF WL 69 | 0 | 11d11h11m11s | 40°C |
| | 3 | 8, 9, 10, 11 | HISTORY VALUE OF WL 69 | 0 | 11d11h11m11s | 40°C |
| | 4 | 12, 13, 14, 15 | HISTORY VALUE OF WL 69 | 0 | 11d11h11m11s | 40°C |
| | 5 | 16, 17, 18, 19 | HISTORY VALUE OF WL 69 | 0 | 11d11h11m11s | 40°C |
| | 6 | 20, 21, 22, 23 | HISTORY VALUE OF WL 20 | 1 | 99d99h99m99s | 20°C |
| | 7 | 24, 25, 26, 27 | HISTORY VALUE OF WL 69 | 0 | 11d11h11m11s | 40°C |
| | 8 | 28, 29, 30, 31 | HISTORY VALUE OF WL 69 | 0 | 11d11h11m11s | 40°C |
| | 9 | 32, 33, 34, 35 | HISTORY VALUE OF WL 69 | 0 | 11d11h11m11s | 40°C |
| | 10 | 36, 37, 38, 39 | HISTORY VALUE OF WL 69 | 0 | 11d11h11m11s | 40°C |
| | 11 | 40, 41, 42, 43 | HISTORY VALUE OF WL 69 | 0 | 11d11h11m11s | 40°C |
| | 12 | 44, 45, 46 | HISTORY VALUE OF WL 69 | 0 | 11d11h11m11s | 40°C |
| | 13 | 47 | HISTORY VALUE OF WL 69 | 0 | 11d11h11m11s | 40°C |
| UPPER TIER | 14 | 48 | HISTORY VALUE OF WL 69 | 0 | 11d11h11m11s | 40°C |
| | 15 | 49, 50, 51 | HISTORY VALUE OF WL 69 | 0 | 11d11h11m11s | 40°C |
| | 16 | 52, 53, 54, 55 | HISTORY VALUE OF WL 69 | 0 | 11d11h11m11s | 40°C |
| | 17 | 56, 57, 58, 59 | HISTORY VALUE OF WL 69 | 0 | 11d11h11m11s | 40°C |
| | 18 | 60, 61, 62, 63 | HISTORY VALUE OF WL 69 | 0 | 11d11h11m11s | 40°C |
| | 19 | 64, 65, 66, 67 | HISTORY VALUE OF WL 69 | 0 | 11d11h11m11s | 40°C |
| | 20 | 68, 69, 70, 71 | HISTORY VALUE OF WL 69 | 1 | 11d11h11m11s | 40°C |
| | 21 | 72, 73, 74, 75 | HISTORY VALUE OF WL 69 | 0 | 11d11h11m11s | 40°C |
| | 22 | 76, 77, 78, 79 | HISTORY VALUE OF WL 69 | 0 | 11d11h11m11s | 40°C |
| | 23 | 80, 81, 82, 83 | HISTORY VALUE OF WL 69 | 0 | 11d11h11m11s | 40°C |
| | 24 | 84, 85, 86, 87 | HISTORY VALUE OF WL 69 | 0 | 11d11h11m11s | 40°C |
| | 25 | 88, 89, 90, 91 | HISTORY VALUE OF WL 69 | 0 | 11d11h11m11s | 40°C |
| | 26 | 92, 93, 94 | HISTORY VALUE OF WL 69 | 0 | 11d11h11m11s | 40°C |
| | 27 | 95 | HISTORY VALUE OF WL 69 | 0 | 11d11h11m11s | 40°C |

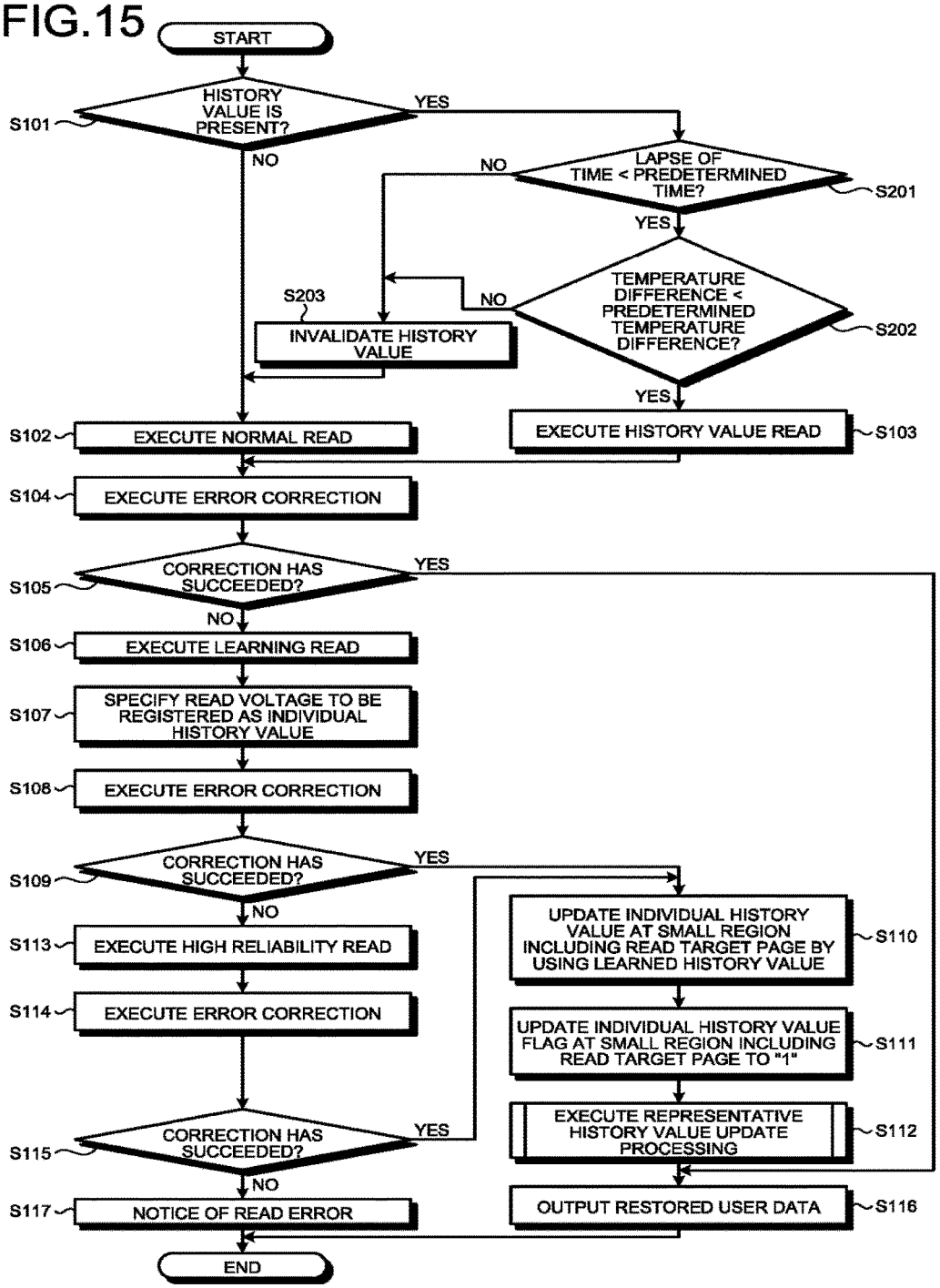

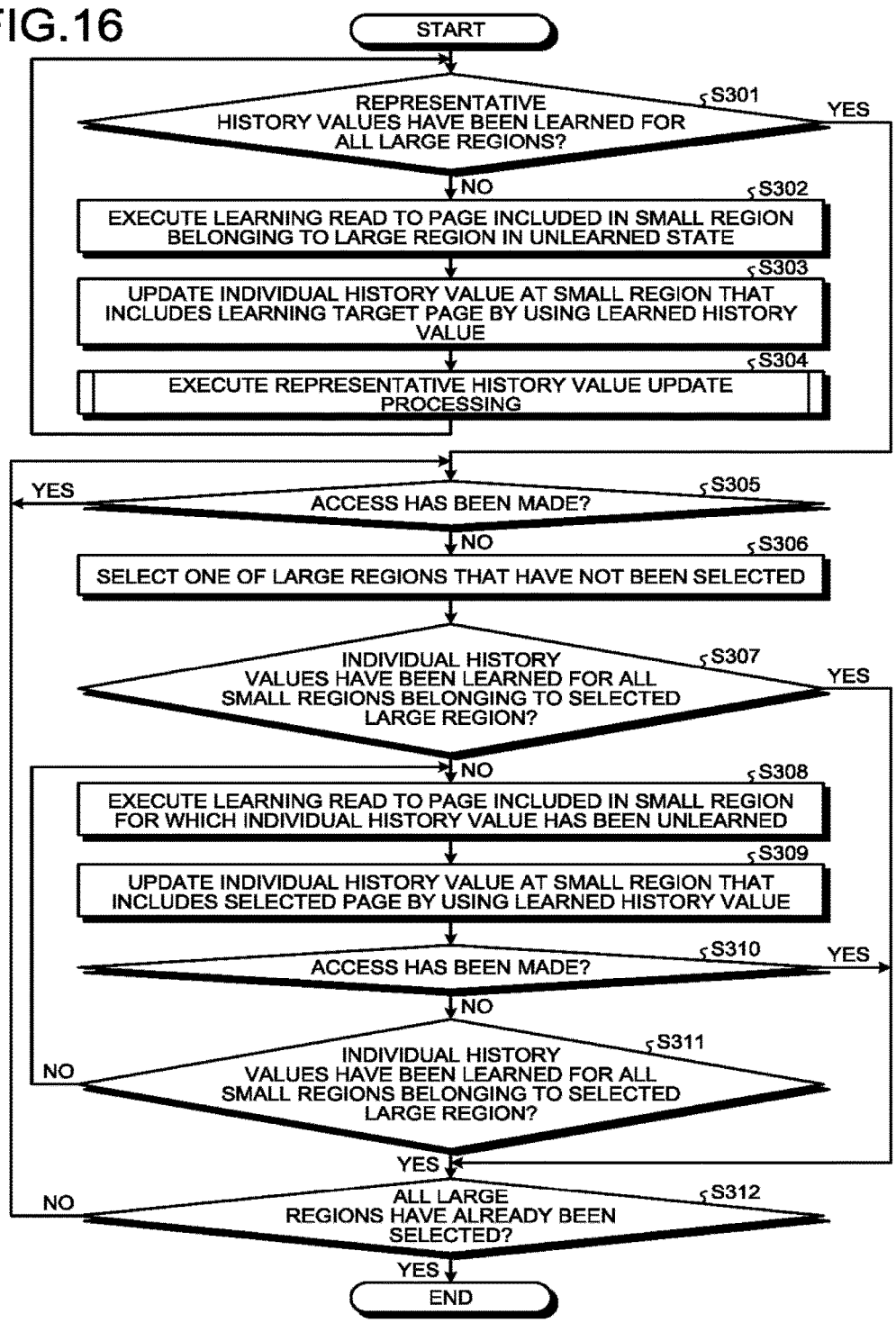

MEMORY SYSTEM, MEMORY SYSTEM CONTROL METHOD, AND PROGRAM

CROSS-REFERENCE TO RELATED APPLICATIONS

This application is based upon and claims the benefit of priority from Japanese Patent Application No. 2018-055211, filed on Mar. 22, 2018; the entire contents of all of which are incorporated herein by reference.

FIELD

Embodiments described herein relate generally to a memory system, a memory system control method, and a program.

BACKGROUND

In a memory system using a NAND type flash memory (which will be referred to as "NAND memory", hereinafter) as a storage medium, a threshold voltage of a memory cell might change because of, for example, data retention and/or read disturb, whereby a bit error rate of data read from the NAND memory is deteriorated, and thus the reliability of the memory system is lowered. Methods for improving the reliability thus lowered may include a shift read that executes a read operation by using a read voltage level shifted from a read voltage level used for a normal read operation (which will also be referred to as "normal read", hereinafter). Hereinafter, a read voltage level will be simply referred to as "read voltage".

BRIEF DESCRIPTION OF THE DRAWINGS

FIG. 3 is a conceptual diagram illustrating an example of a history value management table according to the first embodiment;

FIG. 7 is a diagram illustrating an example of the history value management table, which is set with respect to a physical address space of the memory cell array illustrated in FIG. 6;

FIG. 14 is a diagram illustrating an example of a history value management table according to the second embodiment;

FIG. 15 is a flowchart illustrating an example of a read operation according to the second embodiment; and FIG. 16 is a flowchart illustrating an example of a read operation according to a third embodiment.

DETAILED DESCRIPTION

In general, according to one embodiment, a memory system comprises a nonvolatile memory, and a memory controller configured to manage a history value about setting of a read voltage in performing reading of data from the nonvolatile memory, in accordance with a first management unit and a second management unit, a size of the second management unit being smaller than a size of the first management unit. A first region of the nonvolatile memory corresponds to the first management unit. A plurality of second regions of the nonvolatile memory each correspond to the second management unit. The first region includes the plurality of second regions. The controller is configured to: obtain a first history value for the first region, and obtain a second history value for at least one of the second regions; and in execution of a read operation to a region included in the second regions, when the second history value for the region included in the second regions is not obtained, execute the read operation to the region included in the second regions by using the first history value obtained for the first region.

Exemplary embodiments of a memory system, a memory system control method, and a program will be explained below in detail with reference to the accompanying drawings. The present invention is not limited to the following embodiments.

First Embodiment

Figure 1:
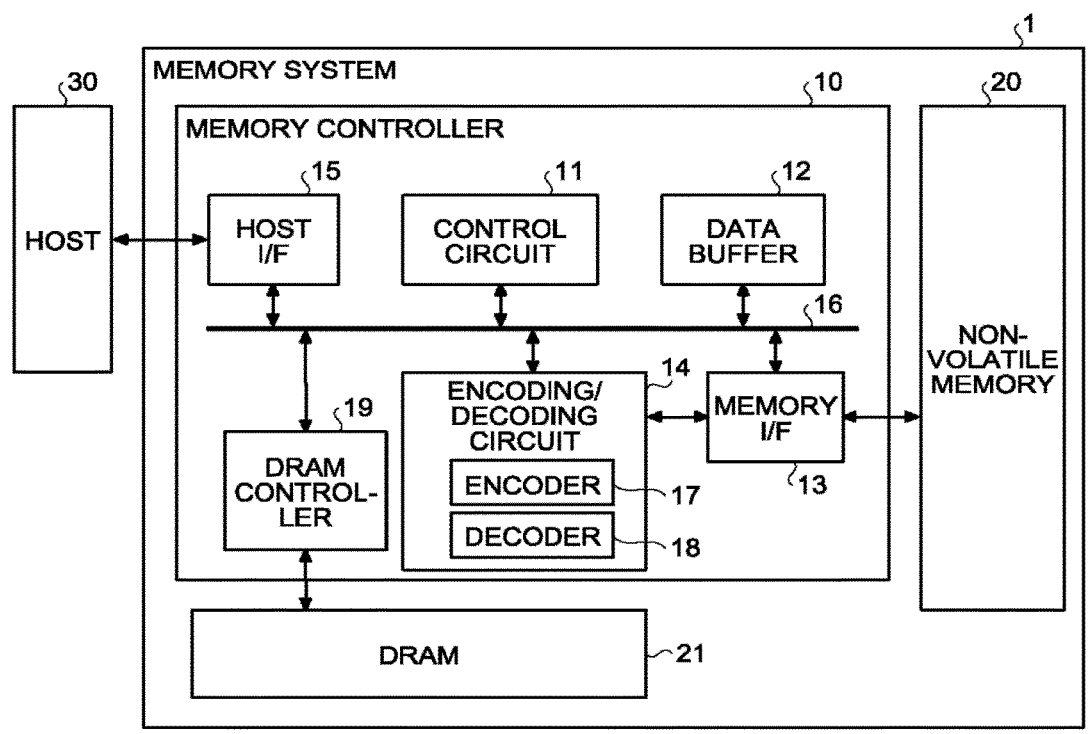
FIG. 1 is a block diagram illustrating a schematic configuration example of a memory system according to a first embodiment.

FIG. 1 is a block diagram illustrating a schematic configuration example of a memory system according to a first embodiment. As illustrated in FIG. 1, the memory system 1 includes a memory controller 10, a nonvolatile memory 20, and a DRAM 21. The memory system 1 can be connected to a host 30, and is illustrated in a state connected to the host 30 in FIG. 1. The host 30 may be electronic equipment, such as a personal computer or a portable terminal device, for example.

The nonvolatile memory 20 is a nonvolatile memory that stores data in a nonvolatile manner, and is a NAND type flash memory (which will be simply referred to as "NAND memory"), for example. The following will describe an example where a NAND memory is used as the nonvolatile memory 20. However, as the nonvolatile memory 20, any memory other than the NAND memory may be used, such as a three-dimensional structure flash memory, a resistance random access memory (ReRAM), or a ferroelectric random access memory (FeRAM). Further, it is not essential that the nonvolatile memory 20 is a semiconductor memory. This embodiment can be applied to various storage media other than the semiconductor memory.

The memory system 1 may be a memory card or the like in which the memory controller 10 and the nonvolatile memory 20 are formed as one package, or may be a solid state drive (SSD) or the like.

The memory controller 10 may be a semiconductor integrated circuit formed as a system-on-a-chip (SoC), for example. Some or all of the functions of each component of the memory controller 10 described below may be realized by a central processing unit (CPU) that executes firmware, or may be realized by dedicated hardware. The CPU in the memory controller 10 is not shown in FIG. 1.

The memory controller 10 controls writing into the nonvolatile memory 20 in accordance with a write request from the host 30. Further, the memory controller 10 controls reading from the nonvolatile memory 20 in accordance with a read request from the host 30. The memory controller 10 includes a host interface (host I/F) 15, a memory interface (memory I/F) 13, a central control circuit 11, an encoding/decoding circuit 14, a data buffer 12, and a DRAM controller 19. The host I/F 15, the memory IF 13, the central control circuit 11, the encoding/decoding circuit 14, and the data buffer 12 are connected to each other by an internal bus 16.

The host IF 15 performs processing that conforms to an interface standard with respect to the host 30, and outputs, to the internal bus 16, a request, user data of a write target, and so forth received from the host 30. Further, the host I/F 15 transmits, to the host 30, user data read from the nonvolatile memory 20 and restored, a response generated by the central control circuit 11, and so forth.

The memory IF 13 performs write operation on the nonvolatile memory 20, on the basis of an instruction from the central control circuit 11. Further, the memory I/F 13 performs read operation on the nonvolatile memory 20, on the basis of an instruction from the central control circuit 11.

The central control circuit 11 conducts overall control on the respective components of the memory system 1. When receiving a request from the host 30 via the host IF 15, the central control circuit 11 performs control in accordance with the request. For example, in response to a write request from the host 30, the central control circuit 11 instructs the memory I/F 13 to write user data and parity into the nonvolatile memory 20. Further, in response to a read request from the host 30, the central control circuit 11 instructs the memory I/F 13 to read user data and parity from the nonvolatile memory 20. The definition of "parity" will be described later.

When receiving a write request from the host 30, the central control circuit 11 determines a storage area on the nonvolatile memory 20 with respect to user data stored in the data buffer 12. In other words, the central control circuit 11 manages write destinations for user data. The correlations between a logical addresses of user data received from the host 30 and a physical addresses representing storage areas on the nonvolatile memory 20 that store the user data are managed by an address conversion table. This address conversion table is stored in, for example, the nonvolatile memory 20, and is read therefrom as needed and cached in the DRAM 21 or the like.

When receiving a read request from the host 30, the central control circuit 11 converts a logical address designated by the read request into a physical address by using the address conversion table described above, and instructs the memory I/F 13 to perform reading from this physical address.

Generally, in a NAND memory, writing and reading are performed in units of data called "page", and erase operation is performed in units of data called "block". In this embodiment, a plurality of memory cells connected to the same word line will be referred to as "memory cell group". Each memory cell stores data on the basis of a threshold voltage written by a write operation. Memory cells may be called differently depending on the possible number of threshold voltage states. For example, when the possible number of threshold voltage states is two, this memory cell is called a "single level cell (SLC)", which can hold data of 1 bit. Further, when the possible number of threshold voltage states is four, this memory cell is called a "multiple level cell (MLC)", which can hold data of 2 bits. When the possible number of threshold voltage states is eight, this memory cell is called a "triple level cell (TLC)", which can hold data of 3 bits. When the possible number of threshold voltage states is sixteen, this memory cell is called a "quad level cell (QLC)", which can hold data of 4 bits. In a case where each memory cell is the SLC, one memory cell group corresponds to one page. In a case where each memory cell is the MLC, TLC, or QLC, one memory cell group corresponds to a plurality of pages. Further, each memory cell is connected to a word line, and is further connected to a bit line. Accordingly, each memory cell can be identified by a combination of an address that identifies a word line and an address that identifies a bit line.

The data buffer 12 temporarily stores user data received by the memory controller 10 from the host 30, until the user data is stored into the nonvolatile memory 20. Further, the data buffer 12 temporarily stores user data read from the nonvolatile memory 20, until the user data is transmitted to the host 30. As the data buffer 12, for example, a general purpose memory may be used, such as a static random access memory (SRAM) or dynamic random access memory (DRAM).

The DRAM controller 19 is a controller that controls accesses from the memory controller 10 to the DRAM 21. The DRAM controller 19 is a controller that enables to access the DRAM 21 at a double data rate (DDR), for example.

The DRAM 21 may be used as a working memory, which is to store the address conversion table; master tables (i.e., snapshots) such as various types of management table, read from the nonvolatile memory 20 and loaded at the startup or the like; and log information that indicates a change log of the various types of management table. Further, the DRAM 21 may also be used as a cache memory when data transfer is performed between the host 30 and the nonvolatile memory 20. Note that an SRAM or the like may be used in place of the DRAM 21.

User data transmitted from the host 30 is transferred through the internal bus 16, and is once stored into the data buffer 12. The encoding/decoding circuit 14 encodes the user data stored in the nonvolatile memory 20, and thereby generates a codeword. Other than the user data, the codeword includes parity, which is to be used for detecting and/or correcting an error in the user data, on the basis of an error detection code and/or error correction code. Further, the encoding/decoding circuit 14 decodes a codeword read from the nonvolatile memory 20, and thereby restores user data. Accordingly, the encoding/decoding circuit 14 includes an encoder 17 and a decoder 18. Here, data treated as an encoding target by the encoding/decoding circuit 14 may include control data and so forth used inside the memory controller 10, other than user data.

In the case of write operation in the memory system 1 configured as described above, when writing data into the nonvolatile memory 20 is to be performed, the central control circuit 11 instructs the encoder 17 to encode the data. At this time, the central control circuit 11 determines a storage location for writing the data in the nonvolatile memory 20, and gives the storage location thus determined to the memory I/F 13. On the basis of the instruction from the central control circuit 11, the encoder 17 encodes the user data in the data buffer 12, and thereby generates write data. The write data thus generated is written via the memory I/F 13 into the storage location designated on the nonvolatile memory 20. Here, as the encoding method of the encoder 17, for example, an encoding method using a low-density parity-check (LDPC) code, Bose-Chaudhuri-Hocquenghem (BCH) code, or Reed Solomon (RS) code may be adopted.

On the other hand, in the case of read operation, when reading data from the nonvolatile memory 20 is to be performed, the central control circuit 11 instructs the memory I/F 13 to read the data, while designating an address on the nonvolatile memory 20. Further, the central control circuit 11 instructs the decoder 18 to start decoding. In accordance with the instruction from the central control circuit 11, the memory I/F 13 executes reading with respect to the designated address on the nonvolatile memory 20, and inputs read data obtained by this reading into the decoder 18. Then, the decoder 18 decodes the read data thus input, and thereby restores the original user data.

In the configuration described above, as read operations that the memory controller 10 instructs the nonvolatile memory 20 to execute, there are a plurality of read operations different in purpose, read time, and/or reliability. In this embodiment, the read operations to be executed by the nonvolatile memory 20 may include at least a read operation that reads data while learning a shift amount, read voltage, and so forth that succeed in reading, (which will be referred to as "learning read", hereinafter); and a shift read that executes reading by using a read voltage shifted on the basis of a history value acquired in the learning read, (which will be referred to as "history value read", hereinafter). Here, "to succeed in reading" in this description means that it is made to succeed in restoring the original data by executing error correction to data that has been read.

Further, in the learning read, a history value learned in units of a page may also be applied to a history value used in units of a word line or in units of a larger region. For example, a shift amount with respect to a certain read voltage can be applied to another read voltage.

Figure 2:
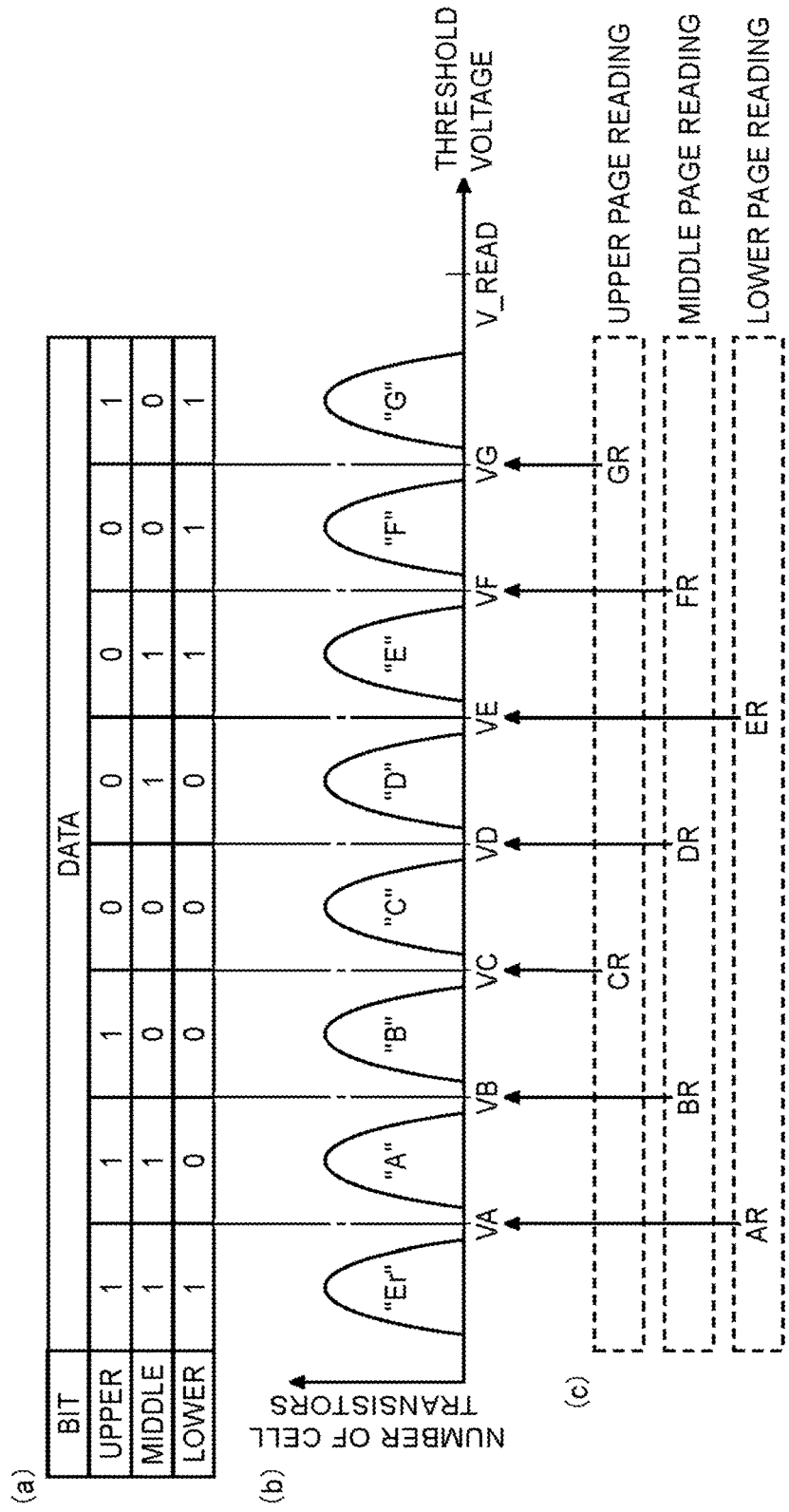
FIG. 2 is a diagram illustrating an example of a bit allocation table, a threshold voltage distribution, and sets of read voltages for respective pages, according to the first embodiment.

FIG. 2 illustrates a bit allocation table, a threshold voltage distribution, and sets of read voltages for respective pages (each of which will be referred to as "read voltage set", hereinafter). FIG. 2-(a) illustrates an example of the bit allocation table based on 2/3/2 coding, which is set with respect to a nonvolatile memory that includes TLCs. FIG. 2-(b) illustrates an example of the threshold voltage distribution in the nonvolatile memory that includes TLCs. FIG. 2-(c) illustrates an example of the read voltage sets to be used in reading respective pages composed of memory cells, where writing has been performed by the 2/3/2 coding illustrated in FIG. 2-(a).

As illustrated in FIGS. 2-(a) and 2-(b), the TLCs store data corresponding to respective states of threshold voltage distribution (i.e., an Er-state to a G-state in FIG. 2-(b)), in accordance with the bit allocation table illustrated in FIG. 2-(a). Further, read voltages VA to VG for differentiating the respective states are set between the respective states.

Further, as illustrated in FIG. 2-(c), read voltage sets each formed of different read voltages are used for reading of respective ones of the upper page, middle page, and lower page. For example, for reading of the upper page, a read voltage set is used, which is composed of a read voltage VC used for reading that differentiates a B-state and a C-state (which will be referred to as "C-level read (CR)", hereinafter), and a read voltage VG used for reading that differentiates an F-state and the G-state (which will be referred to as "G-level read (GR)", hereinafter). Further, for reading of the middle page, a read voltage set is used, which is composed of a read voltage VB used for reading that differentiates an A-state and the B-state (which will be referred to as "B-level read (BR)", hereinafter), a read voltage VD used for reading that differentiates the C-state and a D-state (which will be referred to as "D-level read (DR)", hereinafter), and a read voltage VF used for reading that differentiates an E-state and the F-state (which will be referred to as "F-level read (FR)", hereinafter). Further, for reading of the lower page, a read voltage set is used, which is composed of a read voltage VA used for reading that differentiates the Er-state and the A-state (which will be referred to as "A-level read (AR)", hereinafter), and a read voltage VE used for reading that differentiates the D-state and an E-state (which will be referred to as "E-level read (ER)", hereinafter).

In the learning read, a read voltage shift amount, with which error correction of data that has been read becomes successful, is learned in units of page. As described above, the shift amount thus learned may be applied to the history value in units of a word line or in units of a larger region. Specifically, for example, in read operations to TLCs, a shift amount used for reading of the lower page (for example, the A-level read and the E-level read) may be applied to that for reading of the upper page (for example, the C-level read and the G-level read). At this time, when a shift amount for the A-level read and a shift amount for the E-level read are different from each other, either one of the shift amounts (for example, that for the E-level read) may be applied to those for the C-level read and the G-level read.

It should be noted that the above explanation does not exclude managing the history values individually to each type of pages, such as lower/middle/upper. Here, in a case where the history values are managed individually to each type of pages, for example, even when an individual history value has been learned by reading of the lower page of a word line #0, an individual history value of the middle page of the word line #0 is still in an unlearned state.

Further, other than the above, the read operations may include the normal read, another read operation with higher reliability (which will be referred to "high reliability read", hereinafter), and so forth. Here, being higher in reliability means that the bit error rate of data that has been read is lower. For this high reliability read, a read method among various read systems may be used, such as a read method using an enhanced error correction code, and a shift read using a shift value with higher accuracy, as long as the read method is higher in reliability than at least the normal read. Here, the normal read is a read operation that uses a reference read voltage preset as a read voltage to be applied to word lines in reading. Further, in place of the normal read, or in addition to the normal read, a fast read may be included in the read operations. The fast read is a read operation that shortens the read time by setting a time to apply a read voltage to word lines to be shorter than that of the normal read, for example. Accordingly, when the fast read and the normal read are used together, the fast read may be executed ahead of the normal read, in a read sequence. Further, a shift read in the fast read may be achieved by shifting the read voltage used in the fast read.

The normal read might be high in probability of failure in reading data from a memory cell in which the threshold voltage has been changed, and thus might be high in frequency of execution of a high reliability read (which will be referred to as "retry read", hereinafter). On the other hand, the history value read is capable of reading data from a memory cell in which the threshold voltage has been changed because of data retention, read disturb, etc, and thus has a merit to reduce the probability to cause the retry read with respect to the same page (which will be referred to as "retry rate", hereinafter), which shortens the read time. Here, "being capable of reading data" means that error correction is successful in data that has been read.

Further, the learning read may include a read operation using a shift table (which will be referred to as "shift table read", hereinafter), and a tracking read. The shift table read is a read operation that prepares a shift table in advance in which a plurality of read voltage sets are registered for respective types of page (for example, lower middle upper pages), and executes a read operation by sequentially using respective ones of the plurality of read voltage sets, to learn indexes that specify read voltage sets that succeed in reading. The tracking read is a read operation that executes a read operation a plurality of times while shifting a read voltage by a predetermined pitch width, for example, and thereby creates a distribution histogram of threshold voltages programmed in a plurality of memory cells included in a relevant page (which will be simply referred to as "threshold voltage distribution", hereinafter); then, on the basis of the threshold voltage distribution thus created, this operation learns a shift amount for shifting the read voltage to a voltage level that succeeds in reading. Further, the tracking read may include a read method in which the memory controller 10 performs the learning, and a read method in which the nonvolatile memory 20 performs the learning (which will also be referred to as "self-adjusting read or on-chip tracking read"); in this embodiment, either one of the read methods is adoptable.

In general, in a memory controller that adopts the history value read, a physical address space of the nonvolatile memory 20 is divided into a plurality of regions, and history values are managed in units of the region. For example, when one page is composed of a plurality of memory cells connected to one word line, each region defined with one or more pages serves as a management unit, and one history value is managed with respect to each region.

Here, when each region serving as the management unit is made larger, a history value set at a certain region might be different from the optimum value, because of, for example, variation in shift amount among pages in the management unit, and/or the presence of a page having a unique characteristic. An example of such a page is a page composed of memory cells connected to a word line positioned at the end of each block in a flash memory having a three-dimensional structure. On the other hand, when the management unit is made smaller, since each region requires learning of a history value, the number of times of learning is increased, and the learning time for history values is thereby prolonged. As a result, there may be a case where, for example, after power supply recovery, a time necessary for the read operation to reach the peak performance becomes longer.

Accordingly, in this embodiment, the memory cells of the nonvolatile memory 20 are hierarchically managed by using a hierarchical structure composed of a plurality of hierarchies with different sizes in management unit, and history values are hierarchically managed by using the management units of the respective hierarchies. This enables suitable history values to be set at respective regions while shortening the learning time. Here, in the following description, the expression "to set a history value at a region" includes both of a case where a history value is newly set at a region at which a history value has not yet been set, and a case where a history value is updated at a region at which the history value has already been set.

Specifically, in this embodiment, a hierarchical structure composed of two or more hierarchies is managed in the physical address space of the nonvolatile memory 20. Each hierarchy is different from the other hierarchies in size of the physical address space. For example, an upper hierarchy includes regions set in units of one or more blocks, and a lower hierarchy includes regions set in units of one or more word lines.

In the following description, for the sake of simplicity, a case will be illustrated where a hierarchical structure composed of two hierarchies is set in the physical address space of the nonvolatile memory 20, in which the management unit of a first hierarchy is defined by a large region, and the management unit of a second hierarchy is defined by a small region smaller than the large region.

FIG. 3 is a conceptual diagram illustrating an example of a table for hierarchically managing history values (which will be referred to as "history value management table", hereinafter) according to this embodiment. As illustrated in FIG. 3, each large region belonging to the first hierarchy is correlated with a plurality of small regions belonging to the second hierarchy. Each small region is composed of one or more word lines, for example. In the history value management table illustrated in FIG. 3, the history value at each large region (which will be referred to as "representative history value", hereinafter), and the history value at each small region (which will be referred to as "individual history value", hereinafter) are registered. However, in the initial state, since the individual history values have been unlearned, the history values at small regions are not yet registered. In this case, the history value at each small region is expressed by null (NULL), for example.

In this embodiment, as described above, in the nonvolatile memory 20 in which history values are hierarchically managed by using management units different in size for respective hierarchies, when a read operation is to be executed to a word line included in a small region having its individual history value already registered, this individual history value at the small region is used to execute a history value read. On the other hand, when a read operation is to be executed to a word line included in a small region for which an individual history value has been unlearned (i.e., a small region having NULL, as its individual history value), a representative history value set at the large region that includes this small region is used to execute a history value read. Consequently, when a history value read is to be executed to a small region having no individual history value, it is possible to omit a time necessary for learning a history value, and thereby to shorten the read time.

Further, for a small region that includes a word line having a unique characteristic (which will also be referred to as "unique region") in which a suitable history value might be different from a representative history value, an individually acquired history value may be used to execute a read operation. This enables to reduce the frequency of a history value being different from the optimum value due to the characteristic of the unique region. As a result, it is possible to reduce the probability that the history value read after completion of learning ends up with a read error.

Here, with reference to FIGS. 4 and 5, an explanation will be given of "page", "word line", "block", "plane", "chip", "logical block", and "logical word line". Here, in this description, in order to discriminate the block and the word line from the logical block and the logical word line, the block and the word line will be referred to as "physical block" and "physical word line", respectively, as the case may be. Further, in this description, the chip means a memory chip.

Figure 4:
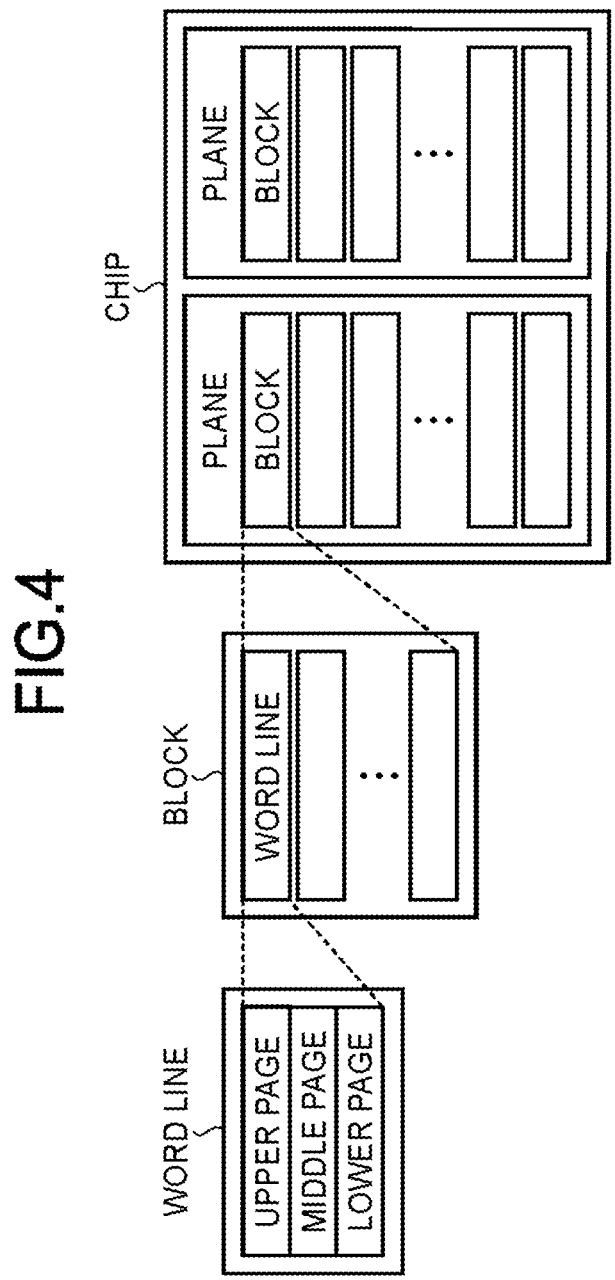
FIG. 4 is a diagram for explaining a relationship among pages, word lines, blocks, planes, and a chip.

As illustrated in FIG. 4, one physical word line includes one or more physical pages. For example, when memory cells are formed of TLCs, as illustrated in FIG. 4, one physical word line includes three physical pages, which are an upper page, a middle page, and a lower page. Further, each physical block is composed of a plurality of physical word lines. Each plane is composed of a plurality of physical blocks. Further, one memory chip is provided with one or more (two in FIG. 4) planes.

Figure 5:
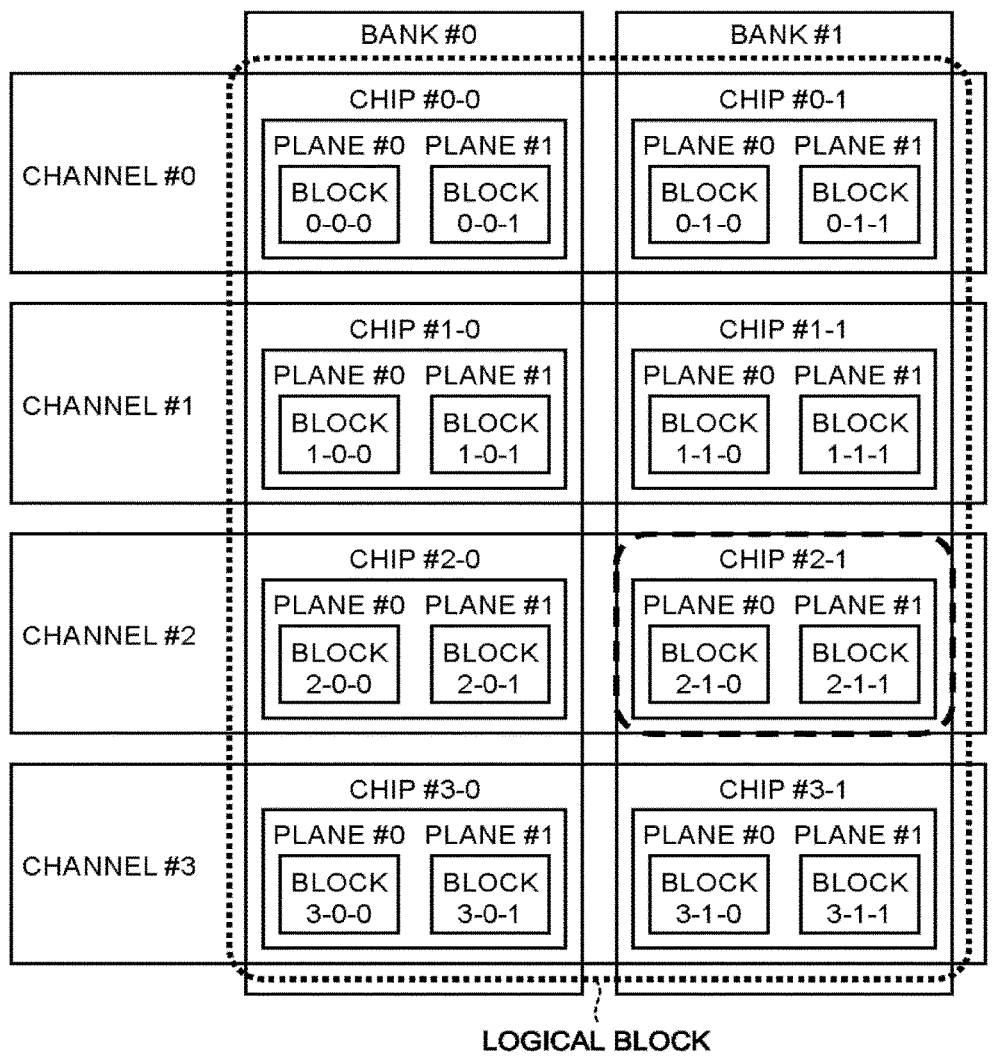
FIG. 5 is a diagram illustrating a schematic configuration example of a nonvolatile memory composed of a plurality of chips inside the memory system according to the first embodiment.

Then, as illustrated in FIG. 5, each logical block is defined as follows: For example, physical blocks are selected one by one with respect to each chip and each plane, and physical blocks thus selected are combined such that a logical block is formed of a combination of physical blocks of one or more chips that correspond to one or more channels and one or more banks. In the memory system 1, state transition and/or erase operation is executed in units of this logical block.

Further, a logical page is an assembly of single physical pages of respective physical blocks in a logical block. Similarly, a logical word line is an assembly of single physical word lines of respective physical blocks composing a logical block.

Here, in this description, inside the same logical block, a form obtained by grouping physical blocks of a plurality of planes in each chip (which will be referred to as "multi-plane processing") will be referred to as "physical block set". Similarly, inside one logical block, a form obtained by applying the multi-plane processing to physical word lines of a plurality of physical blocks in each plane in each chip will be referred to as "physical word line set", and a form obtained by applying the multi-plane processing to physical pages of a plurality of physical word lines in each physical block in each plane in each chip will be referred to as "physical page set".

Further, inside the same physical block, a form obtained by grouping a plurality of physical pages adjacent to each other will be referred to as "physical page group", and a form obtained by grouping a plurality of physical word lines adjacent to each other will be referred to as "physical word line group". Further, a form obtained by applying the multi-plane processing to physical page groups will be referred to as "physical page set group", and a form obtained by applying the multi-plane processing to physical word line groups will be referred to as "physical word line set group". Further, inside the same logical block, a form obtained by grouping a plurality of logical pages adjacent to each other will be referred to as "logical page group", and a form obtained by grouping a plurality of logical word lines adjacent to each other will be referred to as "logical word line group".

In the history value management table illustrated in FIG. 3, as the large region serving as the management unit of the first hierarchy, for example, the physical word line, physical block, physical page set, physical word line set, physical block set, physical page group, physical word line group, physical page set group, physical word line set group, logical block, logical word line, logical word line group, logical page, and logical page group may be adopted.

On the other hand, as the small region serving as the management unit of the second hierarchy, a region is selected to satisfy the condition that this region is smaller than the large region, and, for example, the physical page, physical word line, physical block, physical page set, physical word line set, physical block set, physical page group, physical word line group, physical page set group, physical word line set group, logical word line, logical word line group, logical page, logical page group may be adopted.

In the following description, a case will be illustrated where one block composes one large region, and one to four word lines composes one small region. When each large region is defined by one block, which is a relatively large-sized region, it is possible to reduce to some extent the number of times of learning for respective regions, and thus it is possible to reduce a time necessary for learning. On the other hand, when each small region is defined by one to four word lines, which are relatively small-sized regions, it is possible to reduce to some extent the probability that a history value (i.e., individual history value) becomes different from the optimum value, and thus it is possible to shorten the read time by reducing the retry rate.

Figure 6:
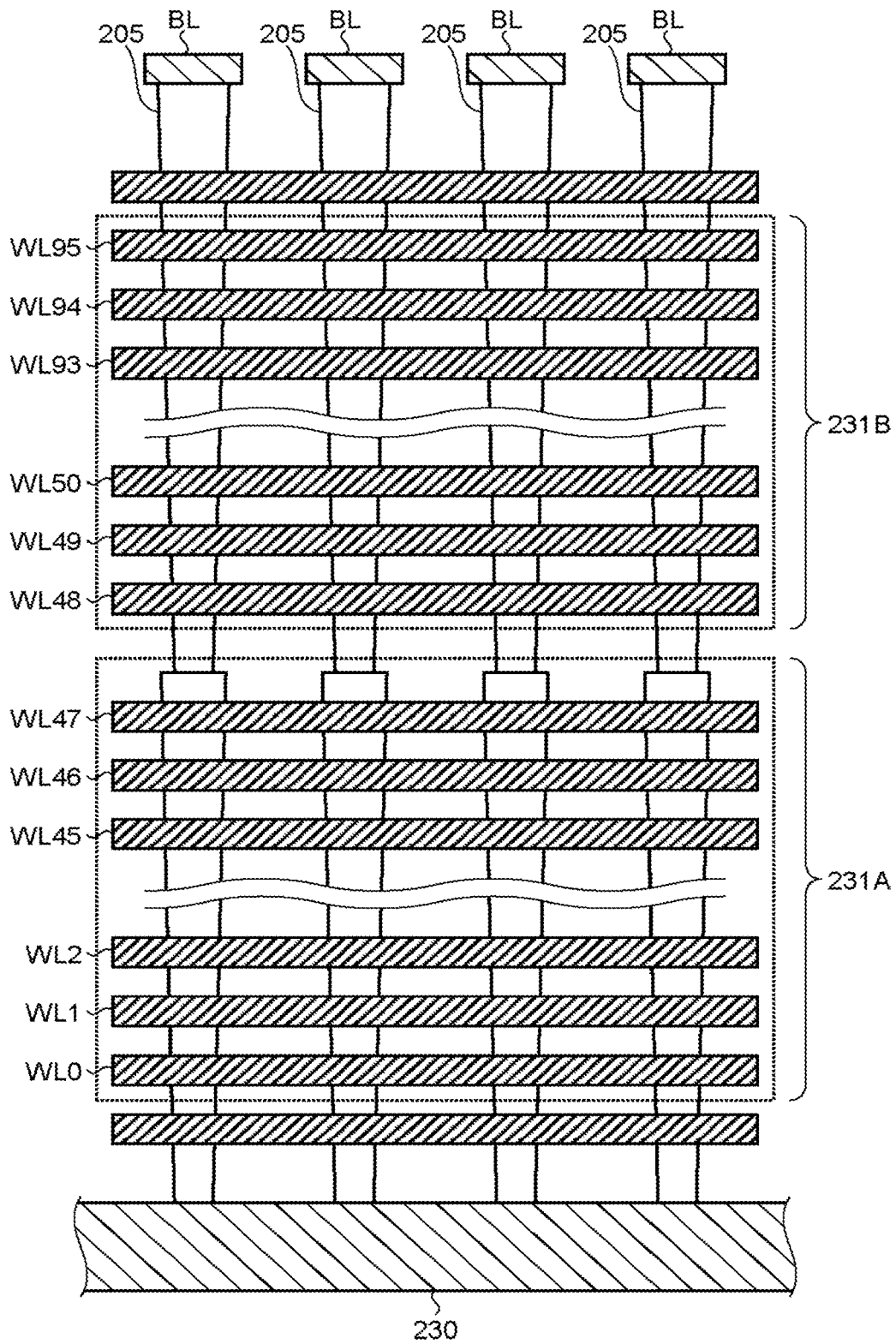
FIG. 6 is a sectional view illustrating an example of a memory cell array having a three-dimensional NAND structure according to the first embodiment.

FIG. 6 is a sectional view illustrating an example of a memory cell array in a case where the nonvolatile memory 20 according to this embodiment is a NAND memory having a three-dimensional NAND structure. FIG. 7 is a diagram illustrating an example of the history value management table, which is set with respect to the physical address space of the memory cell array illustrated in FIG. 6.

The memory cell array illustrated in FIG. 6 has a structure in which a lower tier 231A and an upper tier 231B are stacked on the substrate 230, and each tier has a three-dimensional NAND structure of 48 layers. Thus, in this embodiment, as illustrated in FIG. 7, total 96 word-lines consisting of word lines #0 to #95 are divided into total 28 small regions #0 to #27, each of which is composed of one to four word-lines. In the history value management table illustrated in FIG. 7, a history values is correlated with each small region. Further, in the history value management table illustrated in FIG. 7, in place of the representative history value, an individual history value flag is provided, which is meta information indicating whether a history value correlated with respect to each small region is an individual history value. This individual history value flag may be a binary flag. In this case, for example, an individual history value flag with a value of "1" may indicate that a history value correlated with the relevant small region is an individual history value. On the other hand, an individual history value flag with a value of "0" may indicate that a history value correlated with the relevant small region has been unlearned. However, the value of an individual flag "0" may indicate that a representative history value is correlated when any value is stored as a history value. On the other hand, when any value is not stored as a history value, the history value includes empty data such as null (NULL) data. As described above, also in the configuration that utilizes individual history value flags indicating whether a history value corresponding to each small region is an individual history value or representative history value, the history values can be hierarchically managed.

Further, in the history value management table illustrated in FIG. 7, small regions near the upper end or lower end of each of the tiers include a smaller number of word lines, as compared with small regions near the middle of each of the tiers. For example, at the uppermost end or lowermost end of each of the lower tier 231A and the upper tier 231B, one word line (i.e., a word line #0, #47, #48, or #95) serves as the management unit of the relevant small region. This is because, the number of word lines (corresponding to a small region) that can be collectively treated as those having similar characteristics might differ, in each tier, between a location near the ends and a location near the middle, because changes in variation of cell characteristic (i.e., cell characteristic diversity) might differ with respect to changes in spatial directions (i.e., word line address change). In consideration of the above, in this embodiment, small regions are defined such that word lines near the ends and word lines near the middle are not included therein in a mixed state. Consequently, it is possible to reduce the frequency of a history value being different from the optimum value due to a unique region. Here, this embodiment accepts that word lines of different tiers near the ends are grouped in the same small region. In other words, one or more word lines composing one small region are not necessary required to be continuous in the same tier, but may be discontinuous in the same tier, or may be dispersed in different tier.

As illustrated in FIG. 7-(*a*), in the initial state where history values have not yet been learned, for example in a state immediately after power supply recovery, the history value management table may include null (NULL) as the history value at each small region. Further, each individual history value flag is set to "0".

From this initial state, for example, when a history value for a word line of word line number #20 is obtained by learning, as illustrated in FIG. 7-(*b*), the history value for the word line word line of word line number #20 obtained by a learning read is stored as the history value at a small region of number #6 to which the word line of word line number #20 belongs. The individual history value flag at the small region of number #6 is set to "1" indicating that the history value at the small region of number #6 is an individual history value. Further, as the history values at the small regions of other numbers than #6, the history value for the word line of word line number #20 is stored. The individual history value flags at the small regions of other than number #6 are not updated but kept as "0". This indicates that the history values at the small regions of other numbers than #6 are a representative history value.

Thereafter, for example, when a history value for a word line of word line number #69 is obtained by a learning read, as illustrated in FIG. 7-(*c*), the history value for the word line of word line number #69 obtained by learning is stored as the history value at a small region of number #20 to which the word line of word line number #69 belongs, and the individual history value flag at the small region of number #20 is set to "1". This indicates that, in addition to the history value at the small region of number #6, the history value at the small region of number #20 is an individual history value. Further, among the small regions of other numbers than #20, for the history value at each small region having an individual history value flag of "0", the history value for the word line of word line number #69 is stored. This indicates that the history values at the small regions of other numbers than #6 and #20 are a representative history value.

As described above, in this example, for example, as the history value at a small region subjected to individual learning, a history value obtained by this individual learning is set as an individual history value. Further, at a small region not subjected to learning, a history value obtained by the latest learning may be set as a representative history value. In this way, since a history value obtained by the latest learning is used as a representative history value at a small region not subjected to learning, it is unnecessary to learn a history value for each word line every time when the first access is made to each word line after power supply recovery, and thus it is possible to remarkably shorten the read time.

Here, FIG. 7-(*c*) illustrates a case where the representative history value at each small region having an individual history value flag of "0" is updated by using a history value obtained by the latest learning read (a history value obtained by a learning read for the word line of word line number #69); however, this is not limiting. In this respect, various modifications may be made such that, for example, the representative history value at each small region having an individual history value flag of "0" is not updated by a history value obtained by the latest learning read, but is kept with a history value obtained by the first a learning read (in the example of FIG. 7, a history value obtained by a learning read for the word line of word line number #20). Here, in a case where the representative history value obtained by the first learning read is kept at each small region having an individual history value flag of "0", update of the representative history value is executed by using a history value obtained by a learning read with respect to each small region having an individual history value flag of "0" and having "NULL" stored as a history value.

Figure 8:
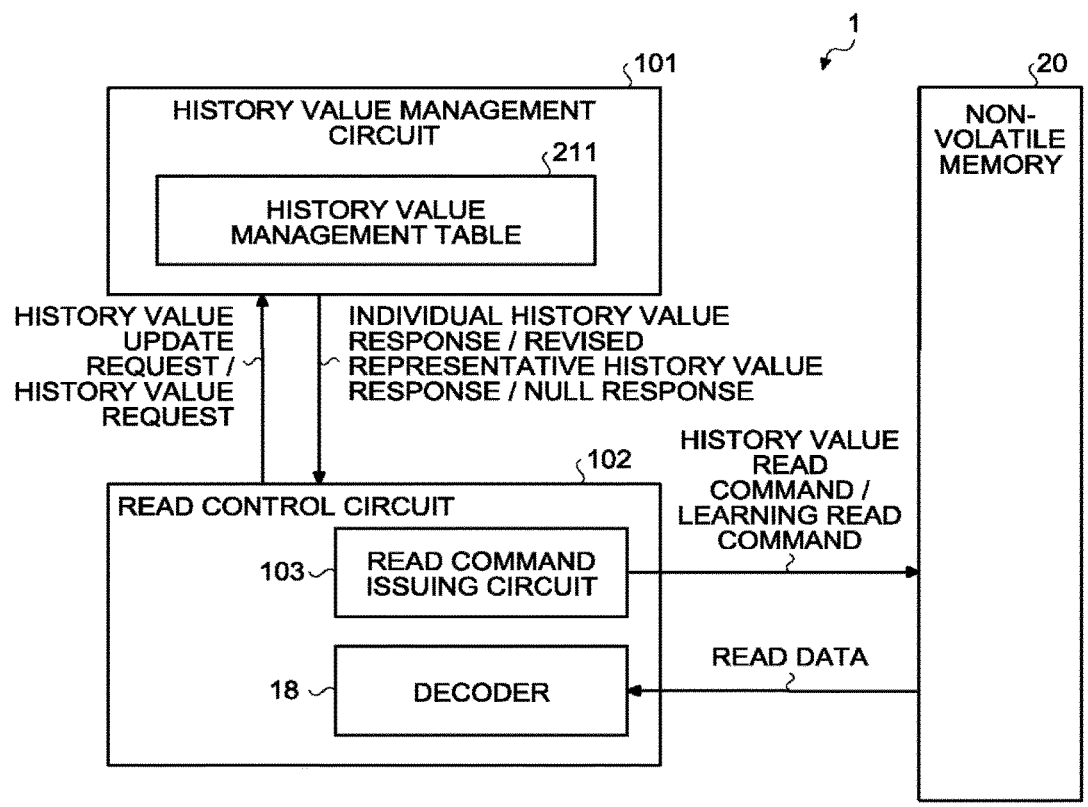
FIG. 8 is a functional block diagram illustrating a functional configuration example for executing a read operation according to the first embodiment.

Next, an explanation will be given of a functional configuration for executing a read operation according to this embodiment in detail with reference to drawings. FIG. 8 is a functional block diagram illustrating a functional configuration example for executing a read operation according to this embodiment. As illustrated in FIG. 8, a memory system 1 according to this embodiment includes a history value management circuit 101 and a read control circuit 102. The history value management circuit 101 manages a history value management table 211. This history value management table 211 is held inside the DRAM 21, for example.

In the above configuration, the history value management circuit 101 manages history values by using the history value management table 211. In response to a request from, for example, the read control circuit 102, the history value management circuit 101 executes registration of a new history value into the history value management table 211, update of a history value already registered, and response with a history value (individual history value or representative history value) set at a region including a word line designated by a read target address. Here, when the history value in response is an individual history value, the history value management circuit 101 may directly send the individual history value to the read control circuit 102 as a response. On the other hand, when the history value in response is a representative history value, the history value management circuit 101 may revise as needed the representative history value acquired from the history value management table 211, and send the received representative history value to the read control circuit 102 as a response.

Here, as the revision processing to be executed to the representative history value by the history value management circuit 101 may include a revision processing to compensate for a change in characteristic caused according to the physical location or the like of a read target word line in a memory chip. In this revision processing, for example, the representative history value is revised in accordance with a revising method preset with respect to the read target address. Here, as the revising method, various methods may be used, such as a method of adding an offset according to a word line address, and a method of performing linear interpolation between two representative history values in accordance with a word line address.

The read control circuit 102 is composed of the central control circuit 11, the data buffer 12, the encoding/decoding circuit 14, and the memory I/F 13, which are included in the configuration illustrated in FIG. 1, and is configured to execute reading of data from the nonvolatile memory 20, decoding of read data, and so forth. The read control circuit 102 includes a read command issuing circuit 103 that issues a read command to a command processing circuit (not illustrated) of the nonvolatile memory 20, and a decoder 18 that decodes read data input from the nonvolatile memory 20. Further, the read command issuing circuit 103 issues, for example, a read command for instructing execution of a history value read, and a read command for instructing execution of a learning read, such as a tracking read or a shift table read. However, read commands to be issued by the read command issuing circuit 103 are not limited to them. A read command may be suitably added or changed, such as a read command for instructing execution of other a high reliability read.

Figure 9:
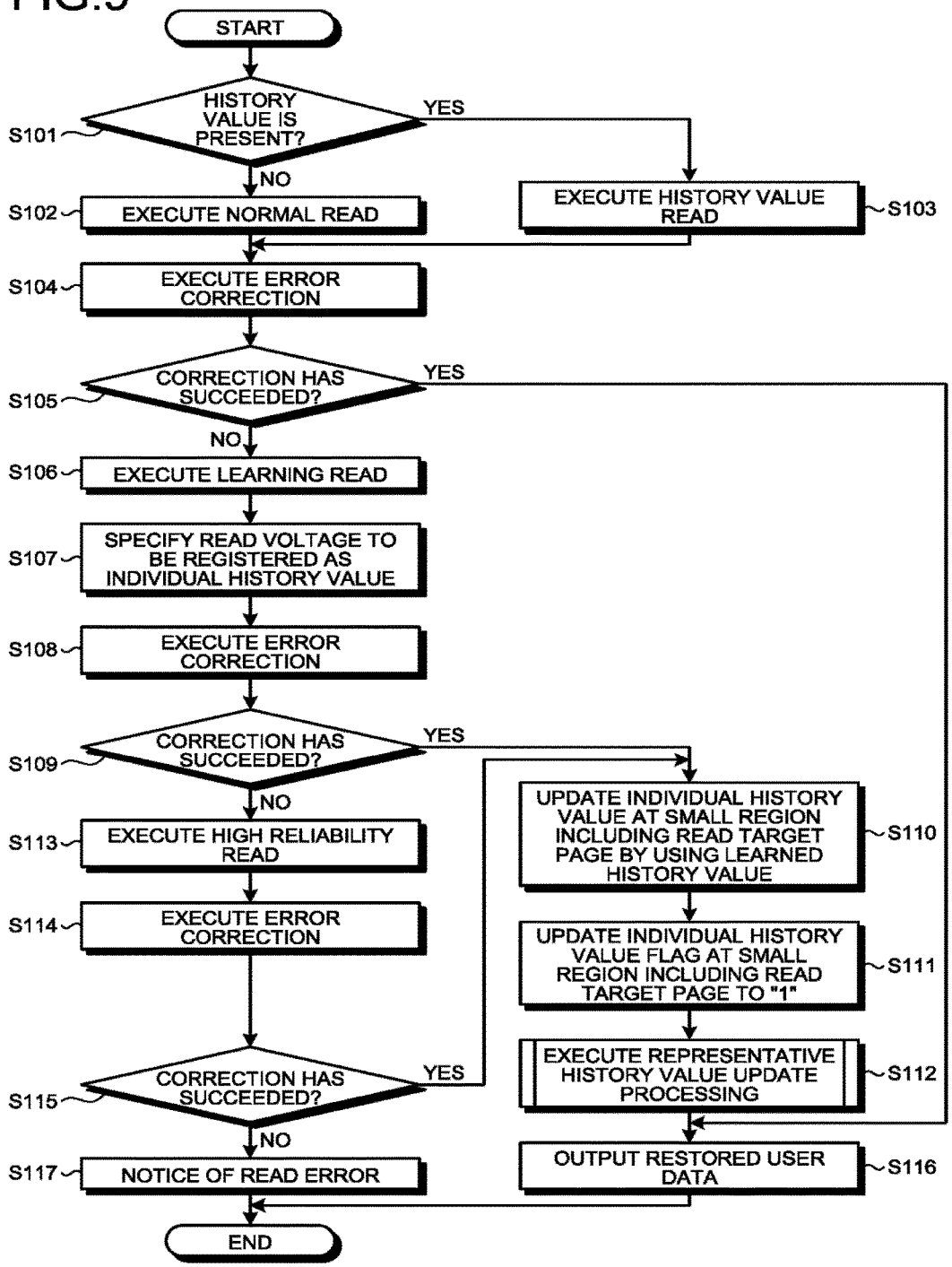
FIG. 9 is a flowchart illustrating an example of a read operation according to the first embodiment.

Next, an explanation will be given of an operation in reading according to this embodiment in detail with reference to drawings. FIG. 9 is a flowchart illustrating an example of a read operation according to this embodiment. Here, the read operation illustrated in FIG. 9 is executed, for example, when a read request is received from the host 30, or when an operation involving a read operation, such as patrol reading or garbage collection, is performed.

As illustrated in FIG. 9, in this operation, the read control circuit 102 first determines whether a history value is set at a small region that includes a word line designated by the physical address of a read target (which will be referred to as "read target address", hereinafter) (step S101). Specifically, as illustrated in FIG. 8, notice of a history value request ("HISTORY VALUE REQUEST" in FIG. 8) is given together with a read target address, from the read control circuit 102 to the history value management circuit 101. Here, in a case where this operation based on a read request from the host 30, the physical address of a read target can be obtained by converting a logical address included in the read request using the address conversion table. In this case, when a history value registered at a small region that includes a word line designated by the read target address is an individual history value in the history value management table 211, the history value management circuit 101 directly inputs this individual history value into the read control circuit 102 ("INDIVIDUAL HISTORY VALUE RESPONSE" in FIG. 8). On the other hand, when the registered history value is a representative history value, the history value management circuit 101 may perform the revision according to, for example, the read target address, to the representative history value acquired from the history value management table 211, and inputs the revised representative history value into the read control circuit 102 ("REVISED REPRESENTATIVE HISTORY VALUE RESPONSE" in FIG. 8). Here, when a history value is not registered, the history value management circuit 101 inputs information of, for example, null (NULL) into the read control circuit 102 ("NULL RESPONSE" in FIG. 8).

When the history value is not set at the small region (NO at step S101), i.e., when a NULL response is made from the history value management circuit 101 to the read control circuit 102, the read control circuit 102 causes the read command issuing circuit 103 to issue a read command for a normal read to the nonvolatile memory 20. Consequently, the nonvolatile memory 20 executes the normal read (step S102). On the other hand, when the history value is set at the small region (YES at step S101), the read control circuit 102 causes the read command issuing circuit 103 to issue a read command for a history value read to the nonvolatile memory 20. At this time, the nonvolatile memory 20 is also given information about a read voltage or its shift amount according to the history value ("INDIVIDUAL HISTORY VALUE" or "REVISED REPRESENTATIVE HISTORY VALUE" in FIG. 8). Consequently, the nonvolatile memory 20 executes the history value read by using the read voltage according to the history value (step S103).

Read data read by the normal read of step S102 or the history value read of step S103 is input into the decoder 18 in the read control circuit 102, and is subjected to error correction executed by the decoder 18 (step S104). When this error correction has succeeded (YES at step S105), i.e., when user data is restored in the decoder 18, the user data thus restored is output to, for example, the data buffer 12 (see FIG. 1) (step S116). Thereafter, this operation ends. Here, in a case where error correction to the read data read by the history value read has succeeded, when the history value used for the history value read is a representative history value, i.e., when a history value is set at a small region but the individual history value flag at this small region is "0", the history value management circuit 101 may update the individual history value flag at this small region to "1" and thereby set the representative history value set at this small region to an individual history value. On the other hand, when the error correction has failed (NO at step S105), this operation proceeds to step S106.

In step S106, the read control circuit 102 causes the read command issuing circuit 103 to issue a read command for executing a learning read to the nonvolatile memory 20. Consequently, the nonvolatile memory 20 executes the learning read, such as a tracking read or a shift table read (step S106). At this time, in the read control circuit 102 or the nonvolatile memory 20, a history value is specified on the basis of a read voltage or shift amount designated in reading, or a read voltage used for reading (step S107).

Read data read in step S106 is input into the decoder 18 in the read control circuit 102, and is subjected to error correction executed by the decoder 18 (step S108). When this error correction has succeeded (YES at step S109), i.e., when user data is restored by the decoder 18, this operation proceeds to step S110. On the other hand, when this error correction has failed (NO at step S109), this operation proceeds to step S113.

In step S110, the individual history value registered at the small region that includes the read target word line in the history value management table 211 is updated by using the history value learned in step S107. Specifically, as illustrated in FIG. 8, the read control circuit 102 outputs a history value update request to the history value management circuit 101. At this time, the read control circuit 102 also gives information for specifying an update target small region (i.e., the read target address) to the history value management circuit 101. Here, as described above, when the history value has been obtained in the nonvolatile memory 20 by a tracking read, such as self-adjusting read (which will also be referred to as "on-chip tracking read"), the history value update request may be output directly from the nonvolatile memory 20 to the history value management circuit 101, or may be output via the read control circuit 102.

Then, at the small region where the individual history value has been updated in step S110, the individual history value flag is changed to "1" (step S111). Consequently, in the history value management table 211, the history value registered at this small region is managed as an individual history value.

Then, processing is executed to update the representative history value at the large region that includes the small region where the individual history value has been updated in step S110 (step S112). An example of this representative history value update processing will be explained later with reference to FIGS. 10 to 12. Thereafter, the restored user data is output to, for example, the data buffer 12 (see FIG. 1) (step S116), and this operation ends. Here, the user data output processing in step S116 and the processing in step S110 to S112 may be executed in parallel.

On the other hand, in step S113, a read operation (i.e., high reliability read) is executed that is higher in reliability than the history value read, tracking read, and shift table read. Read data read by this high reliability read is input into the decoder 18 in the read control circuit 102, and is subjected to error correction executed by the decoder 18 (step S114). When this error correction has succeeded (YES at step S115), i.e., when user data is restored by the decoder 18, this operation proceeds to step S110. On the other hand, this error correction has failed (NO at step S115), notice of read error is given from, for example, the read control circuit 102 to the host 30 (see FIG. 1) (step S117). Thereafter, this operation ends.

Figure 10:
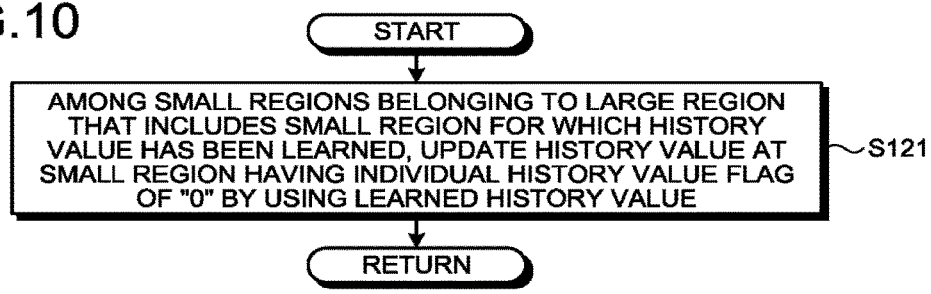
FIG. 10 is a flowchart illustrating an example of a first type of representative history value update processing according to the first embodiment.
Figure 11:
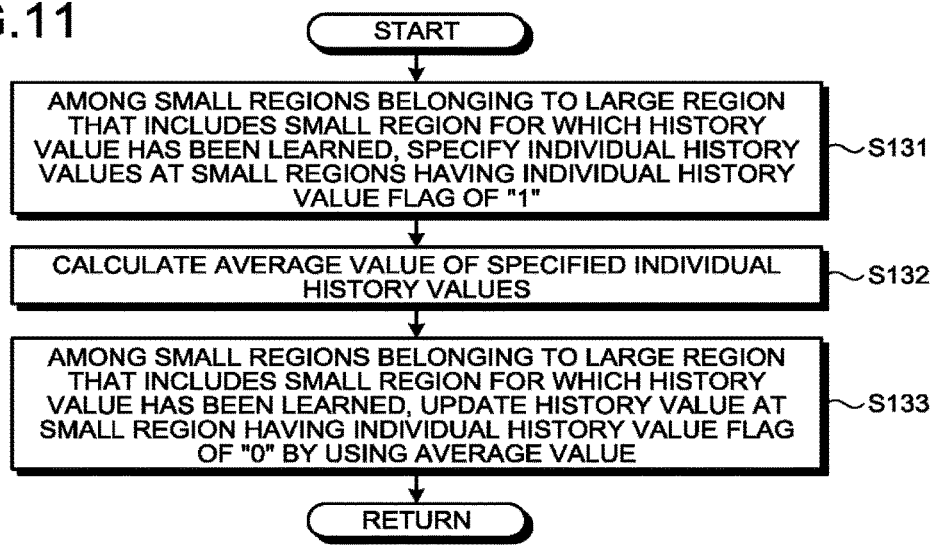
FIG. 11 is a flowchart illustrating an example of a second type of representative history value update processing according to the first embodiment.
Figure 12:
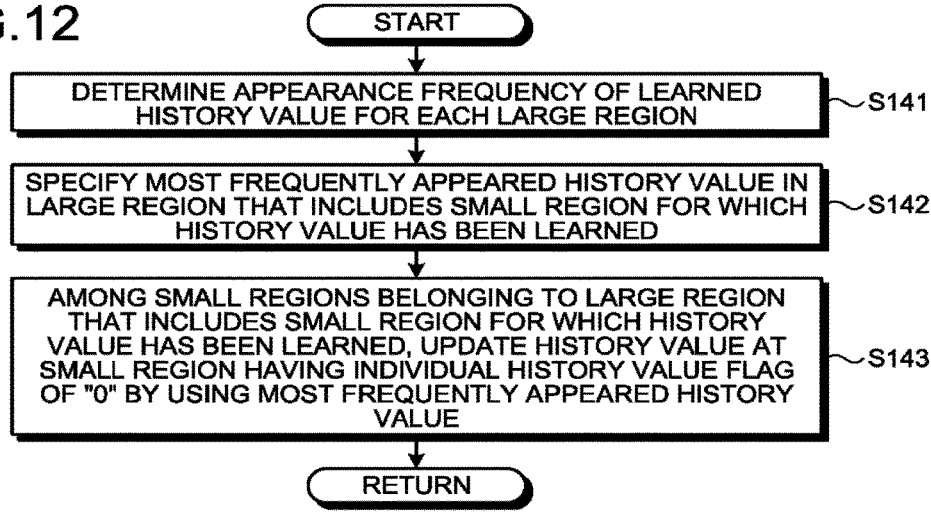
FIG. 12 is a flowchart illustrating an example of a third type of representative history value update processing according to the first embodiment.

Next, an explanation will be given of an example of the representative history value update processing in step S112 of FIG. 9. FIG. 10 is a flowchart illustrating an example of a first type of representative history value update processing according to this embodiment. FIG. 11 is a flowchart illustrating an example of a second type of representative history value update processing according to this embodiment. FIG. 12 is a flowchart illustrating an example of a third type of representative history value update processing according to this embodiment. Here, for each small region with an individual history value flag of "0", the above-described operation that keeps a representative history value obtained by the first learning read may be suitably combined with the operation to be described with reference to FIGS. 10 to 12.

In the first type of representative history value update processing illustrated in FIG. 10, as mentioned in the above description, a history value obtained by the latest learning is set as a representative history value at each small region in an unlearned state. Accordingly, as illustrated in FIG. 10, the first representative history value update processing is arranged as follows. In the history value management table 211, among the small regions belonging to the large region that includes a small region for which a history value has been learned in step S107 of FIG. 9, the history value at each small region having an individual history value flag of "0" is updated by using the history value specified in step S107 of FIG. 9 (step S121). Then, this operation returns to the operation illustrated in FIG. 9.

In the second type of representative history value update processing illustrated in FIG. 11, the average value of individual history values obtained by, for example, learning is used as a representative history value. Accordingly, as illustrated in FIG. 11, the second representative history value update processing is arranged as follows. For example, in the history value management table 211, among the small regions belonging to the large region that includes a small region for which a history value has been learned in step S107 of FIG. 9, the individual history values at small regions having an individual history value flag of "1" are specified (step S131), and then the average value of the individual history values thus specified is calculated (step S132). Here, when the average value thus calculated includes a figure below a decimal point, the figure below the decimal point may be processed by any of rounding-up, rounding-down, or rounding-off, to determine the average value. Then, in the history value management table 211, among the small regions belonging to the large region that includes the small region for which the history value has been learned in step S107 of FIG. 9, the history value at each small region having an individual history value flag of "0" is updated by using the average value calculated in step S132 (step S133). Thereafter, this operation returns to the operation illustrated in FIG. 9.

In the third type of representative history value update processing illustrated in FIG. 12, among history values obtained by, for example, learning, the history value highest in appearance frequency is used as a representative history value. Accordingly, as illustrated in FIG. 12, the third representative history value update processing is arranged as follows. For example, every time a history value is learned in step S107 of FIG. 9, the appearance frequency of the history value thus learned is determined by using, for example, a counter (not illustrated), for each large region, in units of a small region included in this large region (step S141). Then, in accordance with the appearance frequency thus determined, in the history value management table 211, the most frequently appeared history value is specified in the large region that includes a small region for which a history value has been learned in step S107 of FIG. 9 (step S142). Then, in the history value management table 211, among the small regions belonging to the large region that includes the small region for which the history value has been learned in step S107 of FIG. 9, the history value at each small region having an individual history value flag of "0" is updated by using the most frequently appeared history value specified in step S142 (step S143). Thereafter, this operation returns to the operation illustrated in FIG. 9.

As described above, according to this embodiment, when a read operation is to be executed to a word line included in a small region for which a history value has been unlearned, a representative history value set at the large region that includes this small region is used to execute a history value read. Consequently, in a history value read executed on a small region having no individual history value, a time necessary for learning a history value can be omitted, and the read time can be thereby shortened.

Second Embodiment

Next, an explanation will be given of a memory system, a memory system control method, and a program according to a second embodiment in detail with reference to drawings. In the second embodiment, when the effectiveness of a history value seems to have fallen, such as when the freshness of a history value has declined because of a lapse of long time from learning of the history value, or when there is a large difference between the temperature in learning and the temperature in reading, the history value read is skipped, or the existing history value is invalidated and a new history value is acquired again. In the following description, for the arrangements, operations, and effects the same as those of the embodiment described above, the former description is incorporated by reference, and their repetitive description will be omitted. Here, "freshness" in this description is one index for evaluating the effectiveness of a history value, and, for example, this may be an index that declines depending on a lapse of time from learning of the history value.

Figure 13:
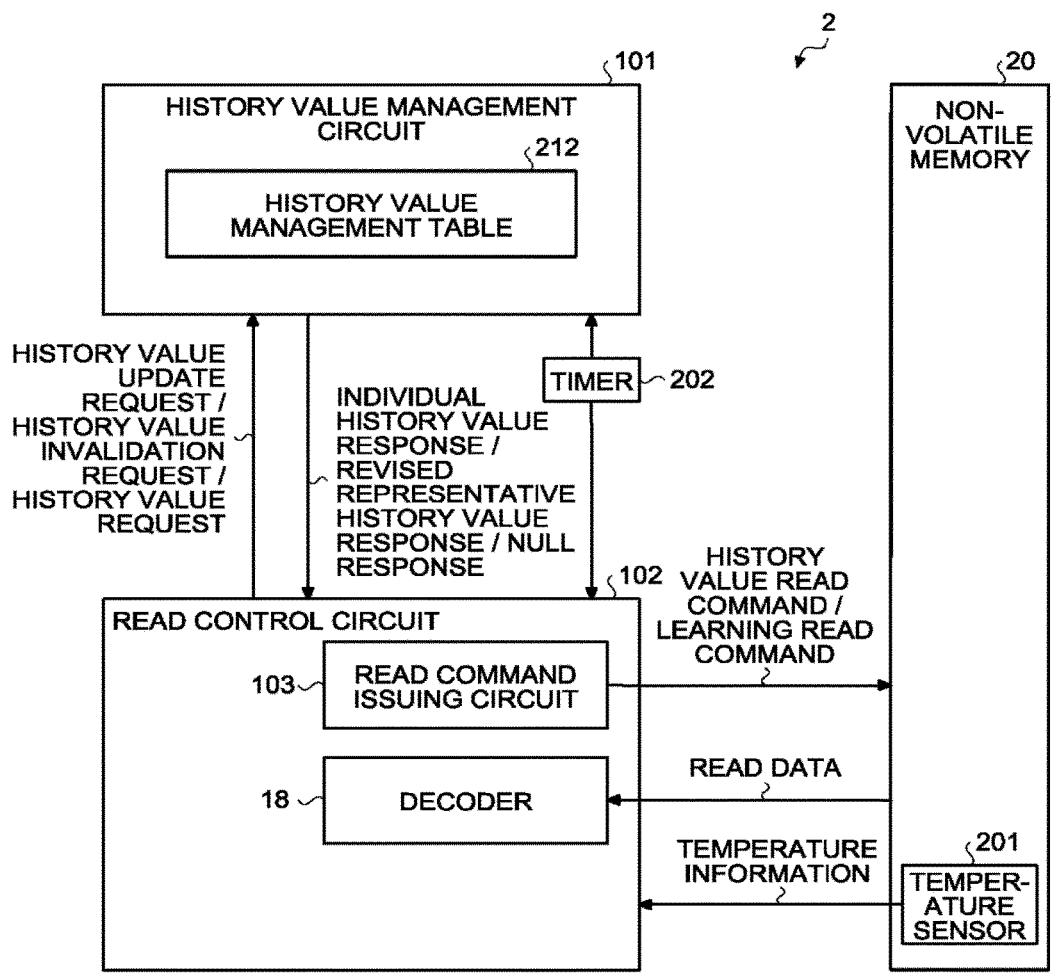
FIG. 13 is a functional block diagram illustrating a functional configuration example for executing a read operation according to a second embodiment.

A schematic configuration example of a memory system according to this embodiment may be the same as that of the memory system 1 described with reference to FIG. 1 in the first embodiment. However, a functional configuration example for executing a read operation according to this embodiment is as illustrated in FIG. 13. Further, the history value management table according to this embodiment is as a history value management table 212 illustrated in FIG. 14.

As illustrated in FIG. 13, the memory system 2 according to this embodiment includes a timer 202 and a temperature sensor 201, in addition to the configuration of the memory system 1 illustrated in FIG. 8. Further, as illustrated in FIG. 14, in the history value management table 212 according to this embodiment, an update time and a learning-time temperature are correlated with each small region, in addition to the configuration of the history value management table 211 illustrated by using FIG. 7.

By referring to, for example, the timer 202, the history value management circuit 101 specifies the time when a history value learned in the nonvolatile memory 20 is input via the read control circuit 102, or the time when a history value in the history value management table 212 is updated. Then, as illustrated in FIG. 14, the history value management circuit 101 registers the time thus specified (which will be referred to as "update date", hereinafter), in correlation with each history value updated in the history value management table 212 inside the DRAM 21.

Further, in this embodiment, the temperature in learning of a history value (which will be referred to as "learning-time temperature", hereinafter) is noticed from the temperature sensor 201 in the nonvolatile memory 20 to the history value management circuit 101. As illustrated in FIG. 14, the history value management circuit 101 registers the noticed learning-time temperature, in correlation with each history value updated in the history value management table 212 inside the DRAM 21.

Next, an explanation will be given of an operation in reading according to this embodiment in detail with reference to drawings. FIG. 15 is a flowchart illustrating an example of a read operation according to this embodiment. Here, in the operation illustrated in FIG. 15, the operations corresponding to those illustrated in FIG. 9 are denoted by the same reference symbols, and their detailed description will be omitted.

As illustrated in FIG. 15, in this operation, similarly to step S101 of FIG. 9, it is first determined whether a history value is set at a small region that includes a word line designated by a read target address. At this time, as a response, the read control circuit 102 is notified of information about an update time and a learning-time temperature, together with a history value ("INDIVIDUAL HISTORY VALUE" or "REVISED REPRESENTATIVE HISTORY VALUE" in FIG. 13).

Then, when the history value is set at the small region (YES at step S101), the read control circuit 102 specifies the current time by referring to the timer 202, and calculates a lapse of time on the basis of the current time thus specified and the update time noticed together with the history value. Further, the read control circuit 102 determines whether the lapse of time thus calculated is less than a predetermined time (step S201). Here, the predetermined time may be a time with which the freshness of a history value can be maintained so that the effectiveness of the history value can be maintained, for example.

When the lapse of time is the predetermined time or more (NO at step S201), the read control circuit 102 requests the history value management circuit 101 to invalidate the history value registered at the small region that includes the word line designated by the read target address. In response to this, the history value management circuit 101 invalidates the history value registered at the small region that includes the word line designated by the read target address in the history value management table 212 (step S203). Further, the history value management circuit 101 proceeds to step S102, and executes the subsequent operations as in the first embodiment. Here, the history value thus invalidated is managed as an unlearned history value (for example, NULL).

On the other hand, when the lapse of time is less than the predetermined time (YES at step S201), the read control circuit 102 then acquires the current temperature from the temperature sensor 201 in the nonvolatile memory 20, and calculates a temperature difference on the basis of the current temperature thus acquired and the learning-time temperature noticed together with the history value. Further, the read control circuit 102 determines whether the temperature difference thus calculated is less than a predetermined temperature difference (step S202). Here, the predetermined temperature difference may be a temperature difference that can maintain the effectiveness of the history value. Further, the timing of acquiring the current temperature does not have to be during execution of step S202. In this respect, various modifications may be made, such as a method of acquiring the current temperature at timing before step S101, and a method of periodically measuring temperature and holding this temperature as the current temperature, for example.

When the temperature difference is the predetermined temperature difference or more (NO at step S202), this operation proceeds to step S203, and invalidates the history value registered at the small region that includes the word line designated by the read target address in the history value management table 212. Further, this operation proceeds to step S102, and executes the subsequent operations as in the first embodiment. On the other hand, when the temperature difference is less than the predetermined temperature difference (YES at step S202), this operation proceeds to step S103, and executes the subsequent operations as in the first embodiment. Here, FIG. 15 illustrates an arrangement such that, when the temperature difference is the predetermined temperature difference or more (NO at step S202), step S203 is then executed; however, this is not limiting. In this respect, various modifications may be made such that, for example, step S203 is skipped and step S102 is executed. Further, in FIG. 15, the execution order of step S201 and step S202 may be reversed.

As described above, according to this embodiment, when the effectiveness of a history value seems to have fallen, such as when the freshness of a history value has declined because of a lapse of long time from learning of the history value, or when there is a large difference between the temperature in learning and the temperature in reading, the existing history value is invalidated and a new history value is acquired. Consequently, it is possible to avoid execution of a history value read that is unlikely to succeed in reading, and, as a result, it is possible to shorten the read time.

Here, in the above description, an attribution for determining the effectiveness of a history value is exemplified by a lapse of time from learning and a temperature difference from the temperature in learning; however, this is not limiting. In this respect, it may be arranged to determine the effectiveness of a history value by using various attributions with which the reliability of the history value can be estimated.

The other arrangements, operations, and effects can be the same as those of the embodiment described above, and thus their description in detail will be omitted here.

Third Embodiment

Next, an explanation will be given of a memory system, a memory system control method, and a program according to a third embodiment in detail with reference to drawings. In the embodiments described above, a case where a history value is learned, for example, when a read request is received from the host 30 or when an event involving a read operation such as patrol reading or garbage collection occurs has been explained. On the other hand, in the third embodiment, a case where a history value is learned, for example, at power supply recovery of the memory system or during an idle period of the memory system will be explained. Here, in the following description, for the arrangements, operations, and effects the same as those of the embodiments described above, the former descriptions are incorporated by reference, and their repetitive description will be omitted.

A schematic configuration example of a memory system according to this embodiment can be the same as that of the memory system 1 described with reference to FIG. 1 in the first embodiment. Further, a functional configuration example for executing a read operation according this embodiment can be the same as that of the configuration illustrated in FIG. 8 or 13.

Next, an explanation will be given of a read operation according to this embodiment, to be executed at power supply recovery of the memory system 1 or during an idle period of the memory system 1 with no access from the host 30, in detail with reference to drawings. FIG. 16 is a flowchart illustrating an example of a read operation according to this embodiment.

The read operation illustrated in FIG. 16 is executed, for example, at power supply recovery of the memory system 1, or during an idle period of the memory system 1 to which no access has been made for a predetermined time from the host 30. As illustrated in FIG. 16, in this operation, the history value management circuit 101 first determines whether representative history values have been learned for all the managed large regions (step S301). Here, in using the history value management table 211/212 illustrated in FIG. 7 or 14, it is determined whether representative history values have been learned for all the large regions. When representative history values have been learned for all the large regions (YES at step S301), this operation proceeds to step S305. On the other hand, when there are one or more large regions for which representative history values have been unlearned (NO at step S301), the history value management circuit 101 selects one of the large regions with their representative history values unlearned, and requests the read control circuit 102 to execute a learning read to one or more word lines included in a small region belonging to this large region. In response to this, the read command issuing circuit 103 in the read control circuit 102 issues to the nonvolatile memory 20 a command for executing a learning read to the learning target word lines thus designated. Consequently, the nonvolatile memory 20 executes the learning read on the learning target word lines (step S302).

Then, the history value management circuit 101 acquires a history value learned by the learning read from the nonvolatile memory 20 or read control circuit 102, and updates the individual history value at the small region that includes the learning target word lines in the history value management table, by using the history value thus acquired (step S303). Then, the history value management circuit 101 executes representative history value update processing of updating the representative history value at the large region to which the small region including the learning target word lines belongs (step S304), and then executes step S301 again. Here, the representative history value update processing may be any one of the first to third types of representative history value update processing illustrated in FIGS. 10 to 12 described above.

In step S305, it is determined whether access, such as a read request, has been made from the host 30 to the memory system 1. Here, in step S305, it may also be determined whether an event involving a read operation, such as patrol reading or garbage collection, has occurred. Hereinafter, "access from the host 30" may include a read operation through such an event. When access from the host 30 has been made (YES step S305), this operation temporarily stops the processing until the access from the host 30 completes, to preferentially execute a request from the host 30. On the other hand, when no access from the host 30 has been made (NO at step S305), the history value management circuit 101 selects one of the large regions that have not been selected from the history value management table (step S306), and determines whether individual values have been learned for all the small regions belonging to the large region thus selected (step S307). When individual values have been learned for all the small regions belonging to the selected large region (YES at step S307), this operation proceeds to step S312.

On the other hand, in step S307, when the small regions belonging to the selected large region include one or more small regions for which individual values have not yet been learned (NO in step S307), the history value management circuit 101 selects one of the small regions with their individual values unlearned, from the small regions belonging to the selected large region, and requests the read control circuit 102 to execute a learning read on one or more word lines included in this small region. In response to this, the read command issuing circuit 103 in the read control circuit 102 issues to the nonvolatile memory 20 a command for executing a learning read on the learning target word lines thus designated. Consequently, the nonvolatile memory 20 executes the learning read on the learning target word lines (step S308). Then, the history value management circuit 101 acquires a history value learned by the learning read from the nonvolatile memory 20 or read control circuit 102, and updates the individual history value at the small region that includes the learning target word lines in the history value management table, by using the history value thus acquired (step S309).

Then, for example, as in step S305, it is determined whether access from the host 30 has been made to the memory system 1 (step S310). When access from the host 30 has been made (YES step S310), this operation proceeds to step S312. On the other hand, when no access from the host 30 has been made (NO at step S310), the history value management circuit 101 determines whether individual values have been learned for all the small regions belonging to the large region selected in step S306 (step S311). When individual values have been learned for all the small regions belonging to the selected large region (YES at step S311), this operation proceeds to step S312. On the other hand, when the small regions include a small region for which an individual value has not yet been learned (NO in step 531), the history value management circuit 101 returns to step S308, and executes the subsequent operations.

In step S312, the history value management circuit 101 determines whether all the large regions have already been selected in step S306 (step S312). When all the large regions have already been selected (YES at step S312), this operation ends. On the other hand, when all the large regions have not yet been selected (NO at step S312), the history value management circuit 101 returns to step S305, and executes the subsequent operations.

As described above, according to this embodiment, at power supply recovery of the memory system 1 or during an idle period of the memory system 1, learning of a history value is performed as background processing. Further, according to this embodiment, learning is executed in such order that representative history values for all the large regions are first learned, and individual history values for the small regions are then learned. The learning of representative history values for the large regions is executed most preferentially, for example, and the learning of individual history values for the small regions is executed while host access is given higher preference. However, the learning of representative history values for the large regions does not have to be executed most preferentially, but may be executed while host access is given higher preference. As a result, it is possible to reduce the probability that a learning read is caused when a read request from the host 30 has been made, and thus it is possible to shorten the read time while reducing reliability deterioration.

Here, FIG. 16 illustrates a read operation arranged such that the learning of representative history values for all the large regions, and the learning of individual history values for all the small regions are executed, until access from the host 30 is made (YES at step S305 and YES at step S310); however, this is not limiting. In this respect, for example, an upper limit may be set for the number of times of updating the representative history value and/or individual history value, to finish the operation illustrated in FIG. 16 when the number of times of updating reaches the upper limit.

The other arrangements, operations, and effects can be the same as those of the embodiments described above, and thus their description in detail will be omitted here.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
   a nonvolatile memory; and
   a memory controller configured to manage a history value about setting of a read voltage in performing reading of data from the nonvolatile memory, in accordance with a first management unit and a second management unit, a size of the second management unit being smaller than a size of the first management unit,
   wherein
   a first region of the nonvolatile memory corresponds to the first management unit,
   a plurality of second regions of the nonvolatile memory each correspond to the second management unit,
   the first region includes the plurality of second regions, and
   the controller is configured to:
      obtain a first history value for the first region, and obtain a second history value for at least one of the second regions; and
      in execution of a read operation to a region included in the second regions, when the second history value for the region included in the second regions is not obtained, execute the read operation to the region included in the second regions by using the first history value obtained for the first region.

2. The memory system according to claim 1, wherein the controller is further configured to:
   execute a learning read to learn a history value to be used in a read operation, and
   obtain the first history value for the first region by using a history value learned by the learning read, and obtain the second history value for the at least one of the second regions on the basis of a history value learned by the learning read.

3. The memory system according to claim 2, wherein, when the first history value has already been obtained for the first region, the controller is configured to not update the first history value already obtained for the first region on the basis of the history value learned by the learning read.

4. The memory system according to claim 1, wherein the controller is further configured to:
   execute a learning read to learn a history value to be used in a read operation,
   obtain the second history values for at least two of the second regions by using a history value learned by the learning read,
   calculate an average value of the second history values obtained for the at least two of the second regions, and
   update the first history value obtained for the first region by using the average value.

5. The memory system according to claim 1, wherein the controller is further configured to
   execute a learning read to learn a history value to be used in a read operation,
   obtain the second history values for at least two of the second regions by using a history value learned by the learning read,
   specify a most frequently appeared history value of the second history values obtained for the at least two of the second regions, and
   update the first history value obtained for the first region by using the most frequently appeared history value.

6. The memory system according to claim 1, wherein the first management unit is any one of a physical word line, physical block, physical page set, physical word line set, physical block set, physical page group, physical word line group, physical page set group, physical word line set group, logical word line, logical page, logical word line group, logical page group, and logical block, and
   the second management unit is a region smaller than the first management unit, and is any one of a physical page, physical word line, physical block, physical page set, physical word line set, physical block set, physical page group, physical word line group, physical page set group, logical word line, logical page, logical word line group, logical page group, and physical word line set group.

7. The memory system according to claim 1, wherein the controller is further configured to revise the first history value on the basis of an address of a read target.

8. The memory system according to claim 1, wherein, when a lapse of time from setting of the first history value or the second history value has reached a predetermined time, the controller is configured to invalidate corresponding one of the first history value or the second history value.

9. The memory system according to claim 1, wherein, when a temperature difference between a temperature in setting the first history value or the second history value and a current temperature is a predetermined temperature difference or more, the controller is configured to invalidate corresponding one of the first history value or the second history value.

10. The memory system according to claim 2, wherein
the learning read is a shift table read or a tracking read, and
the history value includes an index for specifying a shift table of read voltages to be used in the shift table read, or a read voltage shift amount specified by the tracking read.

11. The memory system according to claim 1, wherein the controller is configured to:
define the first region and the plurality of the second regions on a basis of addresses in the nonvolatile memory; and
manage history values for respective ones of the first region and the plurality of the second regions on a basis of the addresses.

12. A method of controlling a memory system including a nonvolatile memory and a memory controller configured to manage a history value about setting of a read voltage in performing reading of data from the nonvolatile memory, in accordance with a first management unit and a second management unit, a size of the second management unit being smaller than a size of the first management unit, a first region of the nonvolatile memory corresponding to the first management unit, a plurality of second regions of the nonvolatile memory each corresponding to the second management unit, the first region including the plurality of second regions, said method comprising:
obtaining a first history value for the first region;
obtaining a second history value for at least one of the second regions; and
in execution of a read operation to a region included in the second regions, when the second history value for the region included in the second regions is not obtained, executing the read operation to the region included in the second regions by using the first history value obtained for the first region.

13. The method according to claim 12, further comprising:
executing a learning read to learn a history value to be used in a read operation;
obtaining the first history value for the first region by using a history value learned by the learning read; and
obtaining the second history value for the at least one of the second regions on the basis of a history value learned by the learning read.

14. The method according to claim 13, wherein, when the first history value has already been obtained for the first region, the first history value already obtained for the first region on the basis of the history value learned by the learning read is not updated.

15. The method according to claim 12, further comprising:
executing a learning read to learn a history value to be used in a read operation;
obtaining the second history values for at least two of the second regions by using a history value learned by the learning read;
calculating an average value of the second history values obtained for the at least two of the second regions; and
updating the first history value obtained for the first region by using the average value.

16. The method according to claim 12, further comprising:
executing a learning read to learn a history value to be used in a read operation;
obtain the second history values for at least two of the second regions by using a history value learned by the learning read;
specifying a most frequently appeared history value of the second history values obtained for the at least two of the second regions; and
updating the first history value obtained for the first region by using the most frequently appeared history value.

17. The method according to claim 12, further comprising revising the first history value on the basis of an address of a read target.

18. The method according to claim 12, further comprising,
when a lapse of time from setting of the first history value or the second history value has reached a predetermined time, invalidating corresponding one of the first history value or the second history value.

19. The method according to claim 12, further comprising,
when a temperature difference between a temperature in setting the first history value or the second history value and a current temperature is a predetermined temperature difference or more, invalidating corresponding one of the first history value or the second history value.

20. The method according to claim 13, wherein
the learning read is a shift table read or a tracking read, and
the history value includes an index for specifying a shift table of read voltages to be used in the shift table read, or a read voltage shift amount specified by the tracking read.

* * * * *